US011749208B2

(12) United States Patent
Kim et al.

(10) Patent No.: US 11,749,208 B2
(45) Date of Patent: Sep. 5, 2023

(54) VARIABLE FREQUENCY DISPLAY DEVICE

(71) Applicant: SAMSUNG DISPLAY CO., LTD., Yongin-si (KR)

(72) Inventors: Kyun Ho Kim, Yongin-si (KR); Jung Taek Kim, Yongin-si (KR); Hong Kyu Kim, Yongin-si (KR); Hyung Keun Park, Yongin-si (KR); Joon Suk Baik, Yongin-si (KR); Young Soo Sohn, Yongin-si (KR); Yong Jin Shin, Yongin-si (KR); Se Keun Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/933,551

(22) Filed: Sep. 20, 2022

(65) Prior Publication Data
US 2023/0016947 A1    Jan. 19, 2023

Related U.S. Application Data

(63) Continuation of application No. 17/323,251, filed on May 18, 2021, now Pat. No. 11,475,845.

(30) Foreign Application Priority Data

Sep. 28, 2020 (KR) .......................... 10-2020-0126345

(51) Int. Cl.
G09G 3/3266     (2016.01)
G09G 3/3275     (2016.01)
H10K 59/131     (2023.01)

(52) U.S. Cl.
CPC ......... *G09G 3/3266* (2013.01); *G09G 3/3275* (2013.01); *H10K 59/131* (2023.02);
(Continued)

(58) Field of Classification Search
CPC .. G09G 3/3266; G09G 3/3275; G09G 3/3291; G09G 3/3233; H10K 59/131
See application file for complete search history.

(56) References Cited

U.S. PATENT DOCUMENTS 9,823,729 B2    11/2017   An et al.
10,777,140 B2*  9/2020    Kim ..................... G09G 3/3258
(Continued)

FOREIGN PATENT DOCUMENTS

KR    1020160052942    5/2016
KR    10-1981677       8/2019
KR    1020200080783    7/2020

OTHER PUBLICATIONS

Office Action dated Mar. 3, 2022 in corresponding U.S. Appl. No. 17/323,251.

*Primary Examiner* — Sardis F Azongha
(74) *Attorney, Agent, or Firm* — F. Chau & Associates, LLC

(57) ABSTRACT

A display device includes: a pixel connected to each of a first scan line, a second scan line, and a data line; a scan driver supplying a first scan signal to the first scan line and a second scan signal to the second scan line; a controller dividing one frame period into an active period and a blank period and generating a count signal in which a time duration of the blank period is counted and a power control signal; a data driver supplying a data signal to the data line; and a power supply controlling a source driving voltage supplied to the data driver according to a duration of the blank period based on the power control signal. When the count signal reaches a reference value, the controller supplies a start signal for output of the first scan signal to the scan driver.

20 Claims, 12 Drawing Sheets

(52) U.S. Cl.
CPC ............... *G09G 2310/0278* (2013.01); *G09G 2310/062* (2013.01)

(56) References Cited

U.S. PATENT DOCUMENTS

| | | |
|---|---|---|
| 11,037,506 B2 * | 6/2021 | Noh ..................... G09G 3/3266 |
| 2012/0169698 A1 | 7/2012 | Park et al. |
| 2018/0103231 A1 | 4/2018 | Ahn et al. |
| 2019/0371250 A1 | 12/2019 | Baek et al. |
| 2019/0378459 A1 | 12/2019 | Kim et al. |
| 2020/0082781 A1 | 3/2020 | An et al. |
| 2020/0193915 A1 | 6/2020 | Noh et al. |
| 2022/0101794 A1 | 3/2022 | Kim et al. |

\* cited by examiner

VARIABLE FREQUENCY DISPLAY DEVICE

CROSS-REFERENCE TO RELATED APPLICATION

This U.S. non-provisional patent application is a continuation of co-pending U.S. patent application Ser. No. 17/323,251, titled VARIABLE FREQUENCY DISPLAY DEVICE, and filed on May 18, 2021, which, in turn, claims priority under 35 U.S.C. § 119 to and the benefit of Korean Patent Application No. 10-2020-0126345 filed in the Korean Intellectual Property Office on Sep. 28, 2020, the entire disclosures of which are incorporated by reference.

FIELD

The present disclosure generally relates to display devices, and more particularly relates to a display device that may vary a driving frequency or frame rate.

DISCUSSION OF RELATED ART

A display device may include a pixel unit including a plurality of pixels and a driver for driving the pixels. The driver displays an image in the pixel unit by using an image signal applied from an external graphics processor.

The graphics processor generates image signals by rendering raw data, and a rendering time for generating the image signals corresponding to one frame may vary depending on a type or characteristic of an image. The driver may vary a frame rate according to the rendering time.

However, the number of times light-emitting elements are turned off (e.g., the number of turn-offs) per unit time varies due to a change in the frame rate, and this variation may be recognized as a luminance change and/or a flicker of an image.

SUMMARY

An embodiment of the present disclosure provides a display device that may insert an emission-off period for supplying a reference voltage to a driving transistor of a pixel into a blank period and may control a source driving voltage supplied to a data driver based on a duration of the blank period.

An embodiment of the present disclosure provides a display device that may insert an emission-off period for supplying a reference voltage to a driving transistor of a pixel into a blank period and may control a source driving voltage and/or a reference voltage based on a duration of the blank period.

It shall be understood that the inventive concept is not limited to the embodiments set forth herein, which may be variously extended without departing from the spirit and scope of the present disclosure.

An embodiment of the present disclosure provides a display device including: a pixel connected to a first scan line, a second scan line, and a data line; a scan driver which supplies a first scan signal to the first scan line and a second scan signal to the second scan line; a controller which divides one frame period into an active period and a blank period and generates a count signal in which a time of the blank period is counted and a power control signal, based on a control signal supplied from the outside; a data driver which supplies a data signal to the data line; and a power supply which controls a source driving voltage supplied to the data driver according to a duration of the blank period based on the power control signal. When the count signal reaches a reference value, the controller may supply a start signal for output of the first scan signal to the scan driver.

The reference value may be a duration of a first blank period corresponding to a maximum frame rate sent to the display device.

When a frame rate detected based on the control signal is slower than the maximum frame rate, the blank period may consecutively include the first blank period and the second blank period. The scan driver may supply the first scan signal to the first scan line in a first period included in the second blank period based on the start signal.

The second blank period may include the first period and the second period that are consecutive. The source driving voltage of a first level may be supplied in the first blank period and the first period, and when supply of the first scan signal in the first period ends, the source driving voltage may transition from the first level to a second level larger than the first level.

The power supply may gradually decrease the source driving voltage from the second level during the second period, and a duration of the second blank period may be less than or equal to that of the first blank period.

The source driving voltage supplied in the active period immediately after the second blank period may be the same as the source driving voltage at an ending time point of the second blank period.

When a duration of the second blank period is an integer multiple of that of the first blank period, the source driving voltage supplied in the active period immediately after the second blank period may have the first level.

The pixel may include: a light-emitting element; a first transistor connected between a first driving power source and the light-emitting element, and including a gate electrode connected to a first node; a second transistor connected between the data line and the first node, and including a gate electrode connected to the second scan line; a third transistor that supplies a reference voltage to the second node at which the first transistor and the light-emitting element are connected in response to the first scan signal supplied to a gate electrode thereof; and a storage capacitor connected between the first node and the light-emitting element.

The power supply may further control the reference voltage based on the power control signal.

The reference voltage of a third level may be supplied in the first blank period and the first period, and when supply of the first scan signal in the first period ends, the reference voltage may transition from the third level to a fourth level smaller than the third level.

The power supply may gradually increase the reference voltage from the fourth level during the second period, and a duration of the second blank period may be less than or equal to that of the first blank period.

The reference voltage supplied in the active period immediately after the second blank period may be the same as the reference voltage at an ending time point of the second blank period.

When a duration of the second blank period is an integer multiple of that of the first blank period, the reference voltage supplied in the active period immediately after the second blank period may have the third level.

The active period may include a scan period in which the data signal is written to the pixel by turning-on of the second transistor and the third transistor.

The controller may include: a frame rate detector that detects the frame rate based on a variable frame frequency signal included in the control signal, and generates the count signal; a voltage controller that controls the source driving voltage and a reference voltage supplied to a source electrode of a driving transistor of the pixel, in response to the count signal; and a scan controller that outputs the start signal in response to the count signal.

An embodiment of the present disclosure provides a display device including: a pixel that is connected to a first scan line, a second scan line, and a data line, and includes a first transistor generating a driving current for light-emitting; a scan driver that supplies a first scan signal to the first scan line and a second scan signal to the second scan line; a controller that divides one frame period into an active period and a blank period based on a control signal supplied from the outside, and generates a count signal in which a time of the blank period is counted and a power control signal; a data driver supplying a data signal to the data line; and a power supply controlling a reference voltage supplied to a source electrode of the first transistor according to a duration of the blank period based on the power control signal. When the count signal reaches a reference value, the scan driver may output the first scan signal during the blank period.

The reference value may be a duration of a first blank period corresponding to a maximum frame rate set in the display device.

When a frame rate detected based on the control signal is slower than the maximum frame rate, the blank period may include the first blank period and the second blank period that are consecutive, and the scan driver may supply the first scan signal to the first scan line in a first period included in the second blank period.

The second blank period may include the first period and the second period that are consecutive. The reference voltage of a first level may be supplied in the first blank period and the first period, and when supply of the first scan signal in the first period ends, the reference voltage may transition from the first level to a second level smaller than the first level.

The power supply may gradually increase the reference voltage from the second level during the second period, and the reference voltage supplied in the active period immediately after the second blank period may be the same as the reference voltage at an ending time point of the second blank period.

In a display device according to this embodiment of the present disclosure, since the emission-off period is additionally inserted during the blank period without frame delay, based on the change of the frame rate, it is possible to control luminance flickering due to varying of the driving frequency (frame rate).

In addition, to compensate for luminance deterioration due to an increase in the number of turn-offs of the light-emitting element and the insertion of the emission-off period in the blank period, the voltage difference between the source driving voltage and the reference voltage may be controlled (for example, increased) according to the duration of the blank period. Thus, the gate-source voltage of the first transistor in the active period (or display period) is increased to increase the luminance of the light-emitting element, and the average luminance at an arbitrary frame rate may be similar to the average luminance level at the maximum frame rate.

Accordingly, since the luminance control for the frame is performed through the insertion of the emission-off period, the source driving voltage control, and/or the reference voltage control in real time by the count of the blank periods even in any frame rate change, the average luminance in variable frequency driving may be stabilized, and the image quality may be controlled.

An embodiment of the present disclosure provides a display device comprising: a plurality of pixels, each connected to a power supply line, a data line and a scan line; a controller configured to divide each of a plurality of variable frequency frame periods into a respective active period and a respective blank period, determine a duration of at least one of the respective periods, and provide a scan control output, a data control output, and a power control output based on the determined duration; a scan driver connected to the scan control output and configured to supply a scan signal to the scan line; a data driver connected to the data control output and configured to supply a data signal to the data line; and a power supply configured to vary at least one variable supply voltage for at least one of the data driver or the scan driver based on the power control output.

The variable supply voltage may include at least one variable gate level voltage connected to the scan driver that controls at least one of a gate-on level or a gate-off level of the scan signal based on the determined duration. The variable supply voltage may include at least one variable output connected to the scan driver that controls timing of the scan signal to the scan line in the respective blank period based on the determined duration. The variable supply voltage may include at least one variable output connected to the scan driver that individually controls timing of first and second scan signals to first and second scan lines of a same pixel in the respective blank period based on the determined duration. The variable supply voltage may include at least one variable source driving voltage connected to at least one of the data driver or the plurality of pixels that controls the data signal based on the determined duration. The variable supply voltage may include at least one variable reference voltage connected to the plurality of pixels and a source electrode of a pixel driving transistor based on the determined duration.

However, effects of embodiments are not limited to the effects described herein, and may be variously extended in alternate embodiments without departing from the spirit and scope of the present disclosure.

DETAILED DESCRIPTION

Figure 1:
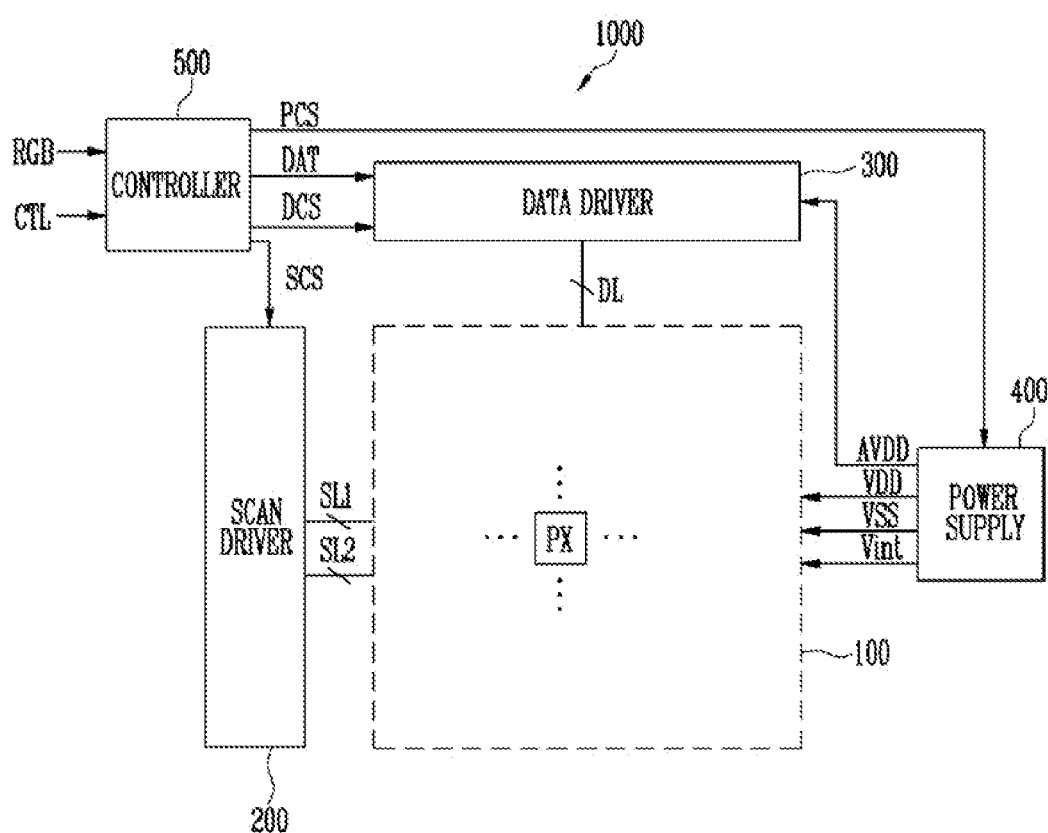
FIG. 1 is a block diagram of a display device according to an embodiment of the present disclosure.

Hereinafter, an embodiment of the present disclosure will be described in detail with reference to the accompanying drawings. The same or like reference numerals may be used for the same or like constituent elements in the drawings, and substantially duplicate descriptions for the same or like constituent elements may be omitted.

FIG. 1 illustrates a display device according to an embodiment of the present disclosure.

Referring to FIG. 1, a display device 1000 may include a pixel unit 100, a scan driver 200, a data driver 300, a power supply 400, and a controller 500. Each of the drivers and/or controller may be implemented as one or more circuits. Alternatively, one or more of the drivers and/or controller may be combined in an integrated circuit.

The display device 1000 may be a flat panel display device, a flexible display device, a curved display device, a foldable display device, a bendable display device, and/or a stretchable display device. In addition, the display device may be applied to a transparent display device, a head-mounted display device, a wearable display device, or the like. In addition, the display device 1000 may be applied to various electronic devices such as a smart phone, a tablet, a smart pad, a TV, or a monitor.

The display device 1000 may be implemented as a self light-emitting display device including a plurality of self light-emitting elements. For example, the display device 1000 may be an organic light-emitting diode display including organic light-emitting elements, a display device including inorganic light-emitting elements, or a display device including light-emitting elements made of a combination of inorganic and organic materials. However, this is exemplary, and the display device 1000 may also be implemented as a liquid crystal display device, a plasma display device, a quantum dot display device, or the like.

In an embodiment, the display device 1000 may be driven during a period divided into an active period for displaying an image (e.g., a display period) and a blank period having a time duration that varies with a change in frame rate (e.g., frame frequency). A duration of the blank period may be adjusted to control a discrepancy between frame information supplied from an external host system (for example, a graphics processor, an application processor, or the like) and timing at which the display device 1000 outputs an image frame.

In an embodiment, the display device 1000 may further include a sensing circuit (for example, 600 in FIG. 16) for calculating a characteristic from pixels PX and generating a compensation value thereof. For example, at least some of the components or functions of the sensing circuit may be integrated into the data driver 300.

The pixel unit 100 includes the pixels PX connected to data lines DL, first scan lines SL1, and second scan lines SL2.

The pixels PX may be supplied with a voltage of a first driving power source VDD, a voltage of a second driving power source VSS, and a reference or initialization voltage Vint.

In FIG. 1, the first scan line SL1 and the second scan line SL2 are shown as connected to the pixel, but the present disclosure is not limited thereto. For example, one or more of the control line, scan line, and/or sensing line may be additionally formed in the pixel unit 100, corresponding to a circuit structure of the pixel PX.

In an embodiment, transistors included in the pixel PX may be N-type oxide thin film transistors. For example, the oxide thin film transistor may be a low temperature polycrystalline oxide (LTPO) thin film transistor. However, this is only an example, and the transistors are not limited thereto. For example, an active pattern or semiconductor layer included in the transistors may include an inorganic semiconductor (for example, amorphous silicon or polysilicon) or an organic semiconductor. In addition, at least one of the transistors included in the display device 1000 may be replaced with a P-type transistor.

The controller 500 may generate a data control signal DCS, a scan control signal SCS, and a power control signal PCS in response to a control signal CTL supplied from the outside. The data control signal DCS generated by the controller 500 may be supplied to the data driver 300, the scan control signal SCS may be supplied to the scan driver 200, and the power control signal PCS may be supplied to the power supply 400.

In addition, the controller 500 may supply image data DAT in which an image signal RGB supplied from the outside is rearranged for the data driver 300.

The data control signal DCS may include a source start signal, and data clock signals. The source start signal may control a sampling starting point of the image data. The data clock signals may be used to control a sampling operation.

The scan control signal SCS may include a start signal and scan clock signals. The start signal may control timing of the scan signal. The scan clock signals may be used to shift the start signal.

The power control signal PCS may control a voltage level and/or supply timing of the reference voltage Vint and a source driving voltage AVDD. The power control signal PCS may further control the voltage level and/or voltage supply timing of the first driving power source VDD, and a voltage level and/or voltage supply timing of the second driving power source VSS. In addition, the power control signal PCS may further control a voltage level of a gate-on voltage and/or a gate-off voltage that determines a gate-on level and a gate-off level of the scan signal.

In an embodiment, the controller 500 may divide one frame period into an active period and a blank period based on the control signal CTL. The controller 500 may count an elapsed time of the blank period, and generate a count signal. The controller 500 may generate the power control signal PCS based on the count signal.

In addition, the controller 500 may supply a start signal for output of a first scan signal supplied to the first scan lines SL1 to the scan driver 200 based on the count signal.

The scan driver 200 may receive the scan control signal SCS from the controller 500. The scan driver 200, which is supplied with the scan control signal SCS, may supply a first scan signal to the first scan lines SL1, and a second scan signal to the second scan lines SL2.

For example, the scan driver 200 may sequentially supply the first scan signal to the first scan lines SL1. The first scan signal may be set as a gate-on voltage (for example, a logic high level) so that the transistors included in the pixels PX may be turned on. The first scan signal may be used to sense or extract a driving current flowing through a pixel (e.g., a current flowing through a driving transistor) or apply the reference voltage Vint to the pixel.

Likewise, the scan driver 200 may supply the second scan signal to the second scan lines SL2. The second scan signal may be used to apply a data signal DS to the pixel PX.

A timing and waveform in which the first scan signal and the second scan signal are supplied may be differently set depending on the active period, the sensing period, and the blank period.

In Although it is shown in FIG. 1 that one scan driver 200 outputs both the first scan signal and the second scan signal, the present disclosure is not limited thereto. For example, the scan driver 200 may include a first scan driver for supplying the first scan signal to the pixel unit 100 and a second scan driver for supplying the second scan signal to the pixel unit 100 (see FIG. 12). That is, the first and second scan drivers may be implemented separately.

The data driver 300 may receive the data control signal DCS from the controller 500. The data driver 300 may supply a data signal DS (e.g., a data voltage) to the pixel unit 100 during the active period of each of the pixels during one frame period. The data signal may be a data voltage for displaying an effective image, such as a voltage corresponding to image data DAT.

As described above, in an embodiment, the data driver 300 may include a function of the sensing circuit. For example, a current or voltage extracted from the pixel PX during the sensing period may be supplied to the data driver 300 through the data line DL. The sensing circuit included in the data driver 300 calculates characteristics (for example, a mobility characteristic, threshold voltage characteristic, degradation characteristic, or the like) of the light-emitting element and/or driving transistor included in the pixel PX based on the extracted current and/or voltage. That is, a function of a sensing line SSL of FIG. 16 may be performed through the data lines DL.

The image data DAT and/or data signal may be controlled, compensated or varied based on the calculated characteristic.

The power supply 400 may supply the reference voltage Vint to the pixels PX through a predetermined power line based on the power control signal PCS. In an embodiment, the power line may be connected in common to all of the pixels PX. For example, the power line may overlap the pixel unit 100 to be patterned in a display panel. Alternatively, the power line may be connected to each of the pixels PX at a predetermined pixel row unit, pixel column unit, or pixel block unit. The power supply 400 may supply the first driving power source VDD and the second driving power source VSS, which are driving power sources of the pixel PX, to the pixel unit 100.

In addition, the power supply 400 may supply the source driving voltage AVDD to the data driver 300. The source driving voltage AVDD may be supplied to the data driver 300 for generating gamma voltages (e.g., grayscale voltages). The gamma voltages are voltages corresponding to the data signals, which are analog voltages. The data driver 300 may divide the source driving voltage AVDD to generate a plurality of gamma voltages.

Figure 2:
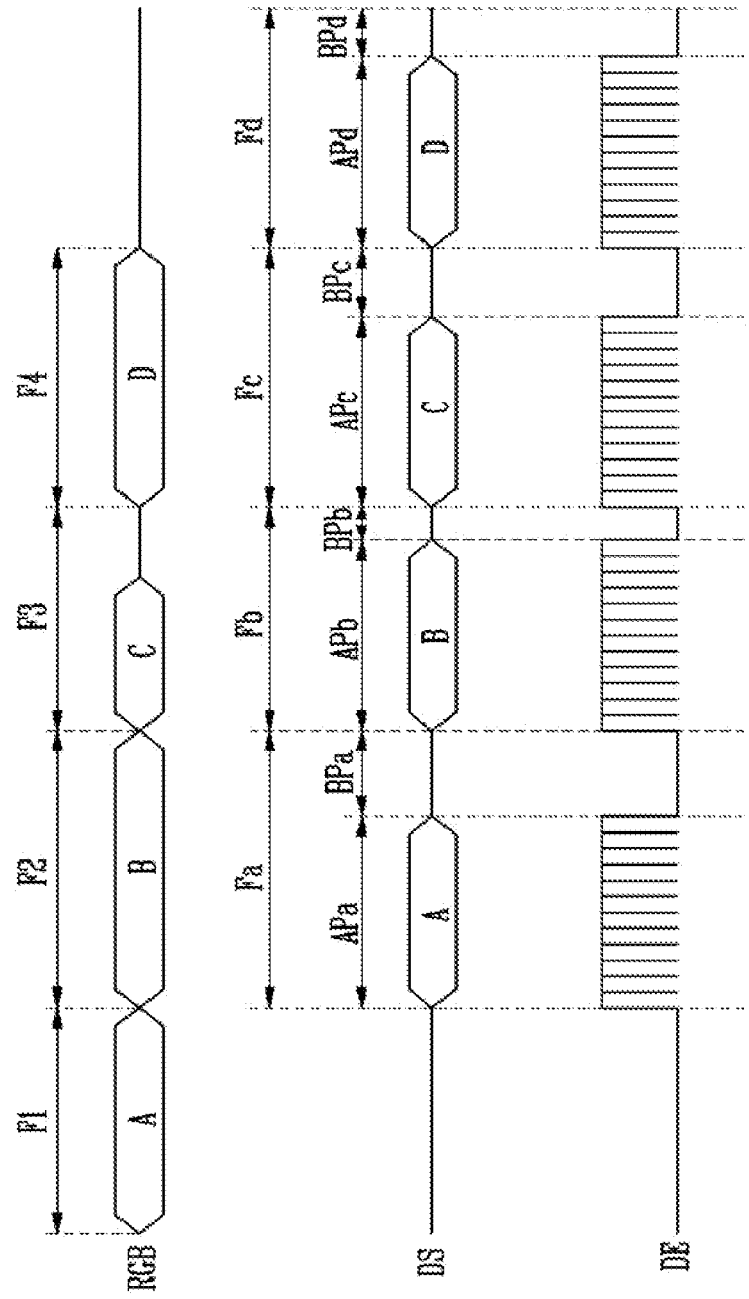
FIG. 2 is a signal timing diagram for driving a display device according to an image signal supplied from the outside.

FIG. 2 illustrates an example of driving a display device according to an image signal supplied from the outside.

Referring to FIG. 1 and FIG. 2, the image signal RGB supplied from the outside may be a signal rendered by a graphics processor or the like. A frame rate of the image signal RGB may be changed according to a rendering time of the graphics processor.

In the following description, the frame rate refers to a frame frequency, such as the number of frames transmitted per second in frames per second. The faster the frame rate, the shorter a time duration and uncompensated blank period of one frame, and the slower the frame rate, the longer the time duration and uncompensated blank period of one frame.

In an embodiment, when the frame rate of the image signal RGB varies according to the rendering time of the graphics processor, the frame rate of the display device 1000 may also be changed.

The image signal RGB may be signal-processed by the controller 500, and then be delayed by one frame to be output as the data signal DS or data voltage. In an embodiment, the data signal DS may be output based on a data enable signal DE supplied from the controller 500.

The frame rate of the display device 1000 may be the same as a frame rate of a frame delayed by one (1) frame (e.g., an immediately previous frame) of the image signal RGB received from the outside. For example, the frame rate of a frame Fa in which the data signal DS "A" of the display device 1000 is output may be the same as the frame rate of a frame F2 in which the image signal RGB "B" is received. The frame rate of a frame Fb in which the data signal DS "B" of the display device 1000 is output may be the same as the frame rate of a frame F3 in which the image signal RGB "C" is received.

One frame of the display device 1000 may include an active period and a blank period in which the data signal DS is output. Time durations of active periods APa, APb, APc, and APd in which the data signals DS "A", "B", "C", and "D" are output in each of frames Fa, Fb, Fc, and Fd may be the same as each other, without limitation thereto. In an embodiment, each of the active periods APa, APb, APc, and APd may include a scan period in which the data signal DS is written to the pixel.

Time durations of blank periods BPa, BPb, BPc, and BPd may be controlled, compensated or varied based on a difference between the frame rate and/or time duration of each of the frames Fa, Fb, Fc, and Fd and each corresponding active period APa, APb, APc, and APd, respectively.

In the example shown in FIG. 2, since the frame rate of the frame Fa in which the data signal DS "A" is output is slower (i.e., time duration is longer) than that of the frame Fb in which the data signal DS "B" is output, a time duration of the blank period BPa may be longer than that of the blank period BPb.

As such, even if the frame rate or time duration of a frame irregularly varies, since the duration of the blank periods BPa, BPb, BPc, and BPd of each of the frames Fa, Fb, Fc, and Fd are controlled, image tearing due to a discrepancy between the frame generation of the graphics processor and the frame output of the display device, and/or an input lag in which a portion of the input frame disappears, may be minimized.

Figure 5:
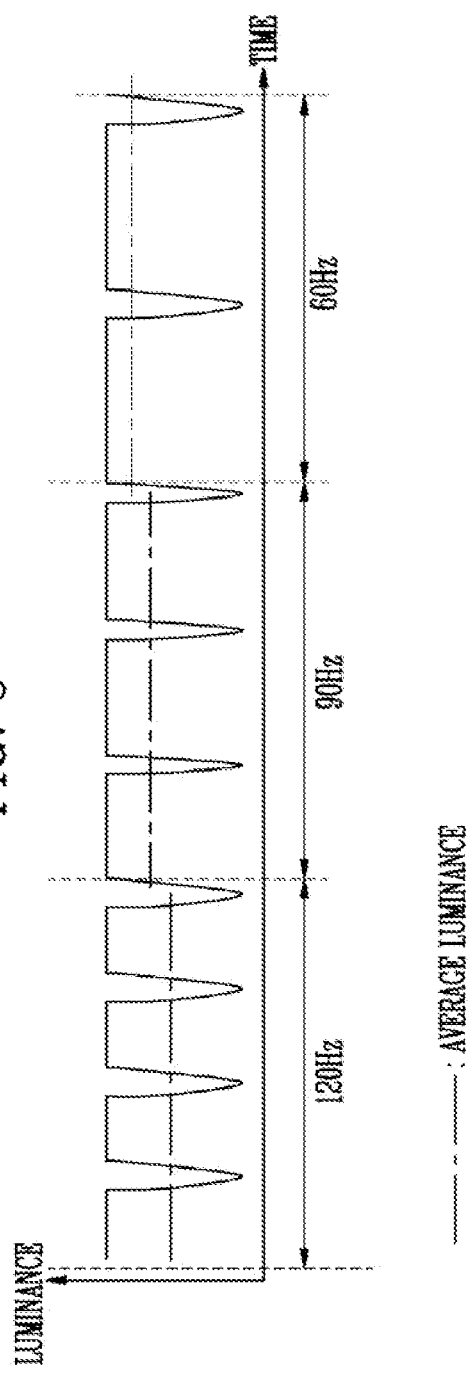
FIG. 5 is a signal timing diagram for a change in luminance of an image due to frame rate.

However, a luminance change or flicker may be recognized due to a change in the blank period according to a change in the frame rate (see FIG. 5). Therefore, a driving method for controlling image quality may be applied in a pixel structure as shown in FIG. 3, and in the driving of FIG.

Figure 4:
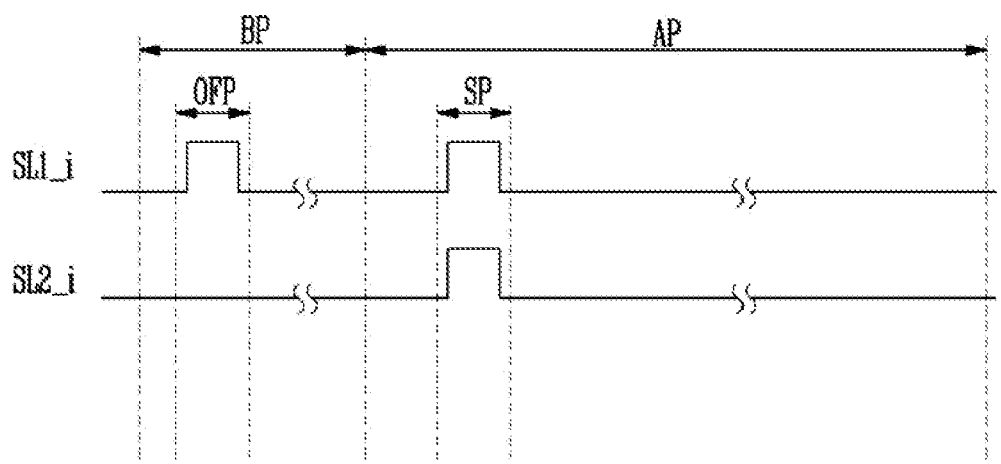
FIG. 4 is a signal timing diagram for an operation of the pixel of FIG. 3.

2 including pixel driving of FIG. 4 which may be referred to as free-sync driving or G-sync driving.

Figure 3:
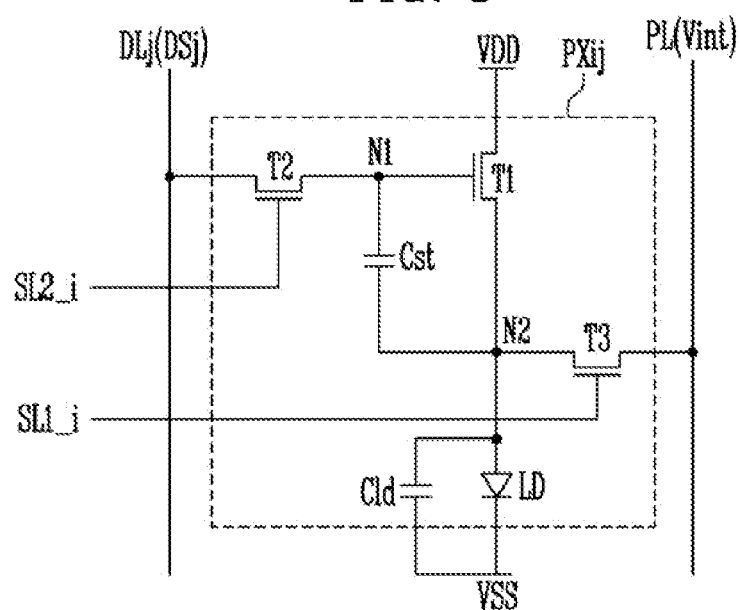
FIG. 3 is a circuit diagram of a pixel included in the display device of FIG. 1.

FIG. 3 illustrates a circuit diagram of an example of a pixel included in the display device of FIG. 1, and FIG. 4 illustrates a timing diagram of an example of an operation of the pixel of FIG. 3.

In FIG. 3 and FIG. 4, for better comprehension and ease of description, a pixel PXij that is disposed at an i-th horizontal line and connected to a j-th data line DLj is illustrated. Hereinafter, an i-th first scan line SL1_i connected to the pixel PXij may be described as a first scan line SL1_i, and an i-th second scan line SL2_i may be described as a second scan line SL2_i.

Referring to FIG. 3 and FIG. 4, the pixel PXij may include a light-emitting element LD, a first transistor T1, a second transistor T2, a third transistor T3, and a storage capacitor Cst.

A first electrode (anode or cathode electrode) of the light-emitting element LD may be connected to a second node N2, and a second electrode (cathode or anode electrode) thereof may be connected to the second driving power source VSS. The light-emitting element LD may generate light of a predetermined luminance in response to an amount of current supplied from the first transistor T1 (e.g., a driving transistor).

In an embodiment, the light-emitting element LD may be an organic light-emitting diode including an organic light-emitting layer. In another embodiment, the light-emitting element LD may be an inorganic light-emitting element made of an inorganic material. In another embodiment, the light-emitting element LD may be a light-emitting element complexly made of an inorganic material and an organic material. Alternatively, the light-emitting element LD may have a form in which a plurality of inorganic light-emitting elements are connected in parallel and/or in series between the second driving power source VSS and the second node N2.

In an embodiment, the pixel PXij may further include a parasitic capacitor Cld of the light-emitting element LD. A voltage difference according to a driving current generated from the first transistor T1 may be stored in the parasitic capacitor Cld. Accordingly, the pixel PXij may emit light with relatively stable luminance during one frame.

A first electrode of the first transistor T1 may be connected to the first driving power source VDD, and a second electrode thereof may be connected to the first electrode of the light-emitting element LD. A gate electrode of the first transistor T1 may be connected to a first node N1. The first transistor T1 may control an amount of current flowing in the light-emitting element LD in response to a voltage of the first node N1.

A first electrode of the second transistor T2 may be connected to the data line DLj, and a second electrode thereof may be connected to the first node N1. A gate electrode of the second transistor T2 may be connected to the second scan line SL2_i. When a second scan signal (e.g., a gate-on level of the second scan signal) is supplied to the second scan line SL2_i, the second transistor T2 may be turned on to transmit a voltage of the data signal DSj from the data line DLj to the first node N1.

A third transistor T3 may be connected between a power line PL and the second electrode (e.g., second node N2) of the first transistor T1. A gate electrode of the third transistor T3 may be connected to the first scan line SL1_i. When a first scan signal (e.g., a gate-on level of the first scan signal) is supplied to the first scan line SL1_i, the third transistor T3 may be turned on to electrically connect the power line PL with the second node N2 (e.g., the second electrode of the first transistor T1 and the first electrode of the light-emitting element LD).

In an embodiment, when the third transistor T3 is turned on, the reference voltage Vint may be supplied to the second node N2 through the power line PL. The reference voltage Vint may serve to set or initialize the voltage of the second electrode (for example, source electrode) of the first transistor T1 at a predetermined value. Therefore, reliability of a driving current generated from the first transistor T1 may be maximized.

In addition, the reference voltage Vint may be set to be less than or equal to the voltage of the second driving power source VSS. Accordingly, when the reference voltage Vint is supplied to the second node N2, the light-emitting element LD does not emit light (emission-off). The reference voltage Vint may initialize a voltage stored in the parasitic capacitor Cld of the light-emitting element LD. When the data signal is supplied to the pixel PXij after the voltage stored in the parasitic capacitor Cld is initialized, the light-emitting element LD may emit light with luminance corresponding to the data signal. Particularly, color reproducibility of low grayscale value emissions may be maximized.

In another embodiment, when the third transistor T3 is turned on, the current generated by the first transistor T1 may be supplied to the sensing circuit of the data driver 300 or the sensing circuit of the controller 500 through a sensing line (not shown).

The storage capacitor Cst may be connected between the first node N1 and the second node N2. The storage capacitor Cst may store a voltage corresponding to a voltage difference between the first node N1 and the second node N2.

In an embodiment of the present disclosure, the circuit structure of the pixel PXij is not limited to that of FIG. 3. For example, the light-emitting element LD may be disposed between the first driving power source VDD and the first electrode of the first transistor T1. In addition, in FIG. 2, the transistors T1 to T3 are illustrated as NMOS, but the present disclosure is not limited thereto. For example, at least one of the transistors T1 to T3 may be formed as PMOS.

As shown in FIG. 4, driving for each pixel PXij may be performed in an active period AP and a blank period BP. The active period AP may include an injection period SP.

In an embodiment, when the display device 1000 is driven at a driving frequency slower than a maximum frame rate set in the display device 1000, the blank period BP may include an emission-off period OFP.

The emission-off period OFP may proceed within the blank period BP. During the emission-off period OFP, the first scan signal is supplied to the first scan line SL1_i, so that the third transistor T3 may be turned on. Accordingly, the reference voltage Vint may be supplied to the second node N2.

In this case, the second scan signal is not supplied to the second scan line SL2_i (e.g., the second scan signal has a gate-off level), and the second transistor T2 is turned off.

When the reference voltage Vint is supplied to the second node N2, light-emitting of the light-emitting element LD may be momentarily turned off. Accordingly, the luminance of the pixel PXij may momentarily decrease. In this case, a current path through the first transistor T1 and the third transistor T3 may be formed. In an embodiment, the reference voltage Vint may be less than or equal to the voltage of the second driving power source VSS.

When the emission-off period OFP elapses, the current generated by the first transistor T1 is supplied to the light-emitting element LD, so that the light-emitting element LD may emit light again. In an embodiment, the emission-off period OFP is a short period of one horizontal period or less, and the luminance after the emission-off period OFP may be similar to the luminance before the emission-off period OFP.

Meanwhile, the emission-off period OFP may sequentially proceed in pixel row units. However, this is exemplary, and the emission-off period OFP may simultaneously proceed for predetermined pixel rows.

Thereafter, the data signal DSj is supplied to the pixel PXij during the active period AP, and the light-emitting element LD may emit light with luminance corresponding to the data signal DSj.

In an embodiment, the first scan signal and the second scan signal may be supplied to the first scan line SL1_i and the second scan line SL2_i in the scan period SP of the active period AP, respectively. In addition, the data signal DSj may be supplied to the data line DLj during the scan period SP. Thus, the second transistor T2 may be turned on to supply the voltage of the data signal DSj to the first node N1, and the third transistor T3 may be turned on to supply the reference voltage Vint to the second node N2.

Accordingly, a voltage amount corresponding to a difference between the voltage of the data signal DSj and the reference voltage Vint may be stored in the storage capacitor Cst.

Since the reference voltage Vint is supplied to the second node N2 even during the scan period SP, light-emitting of the light-emitting element LD may be momentarily turned off. In this case, a current path through the first transistor T1 and the third transistor T3 may be formed. Accordingly, the luminance of the pixel PXij may momentarily decrease.

In an embodiment, the scan period SP may sequentially proceed in pixel row units, or may simultaneously proceed for predetermined pixel rows.

After the scan period SP, the second and third transistors T2 and T3 may be turned off. The light-emitting element LD may emit light with luminance corresponding to a voltage stored in the storage capacitor Cst. In the active period AP after the scan period SP, an effective image to be substantially displayed in the corresponding frame may be displayed.

FIG. 5 illustrates an example of a change in luminance of an image according to a frame rate.

Referring to FIG. 1, FIG. 2, FIG. 4, and FIG. 5, luminance of a display device displaying an image in a variable frame rate driving method may vary according to a change in the frame rate for the same grayscale value.

In the scan period SP of the active period AP, an image may be displayed in black for a very short time due to non-light-emitting of the light-emitting element LD. Accordingly, as shown in FIG. 5, a period in which luminance corresponding to such a scan period SP is decreased occurs.

FIG. 5 shows a change in luminance according to a frame rate during the same time period in a conventional frame rate driving method. For example, in a frame rate condition of 120 Hz, the scan period SP may be repeated 4 times during the same time, and in a frame rate condition of 90 Hz, the scan period SP may be repeated 3 times during the same time, and in a frame rate condition of 60 Hz, the scan period SP may be repeated twice.

As described above, as the number of repetitions of the scan period SP increases, average luminance for the same grayscale value may decrease. That is, as shown in FIG. 5, for the same grayscale value, the average luminance of driving of the frame rate of 120 Hz may be lower than that of driving of the frame rate of 90 Hz. Similarly, for the same grayscale value, the average luminance of driving of the frame rate of 90 Hz may be lower than that of driving of the frame rate of 60 Hz.

Figure 7:
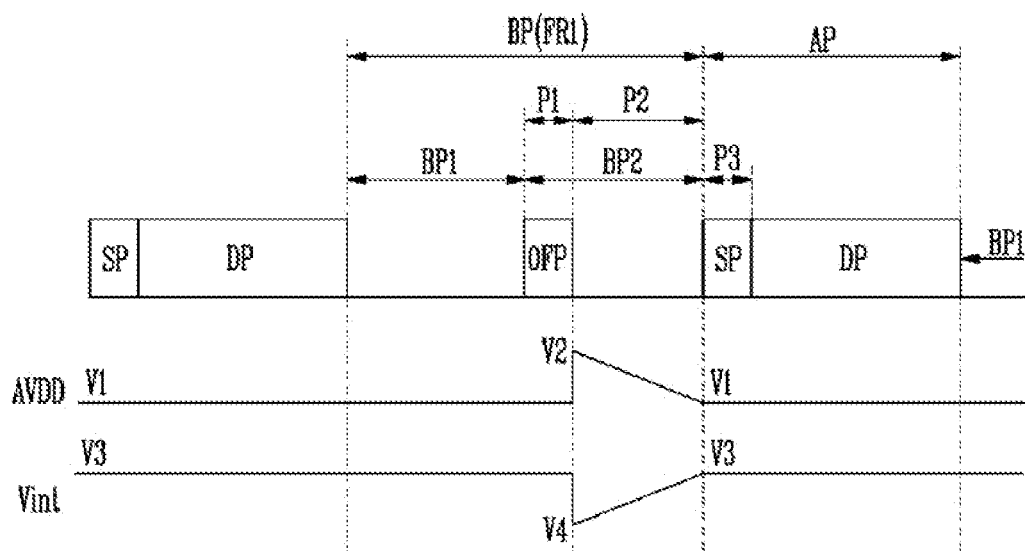
FIG. 7 is a signal timing diagram for an operation of the display device of FIG. 1.

In order to control or minimize the luminance deviation due to the frequency and/or time duration difference of the scan period SP versus a previous scan period, the display device 1000 and the driving method thereof according to this embodiment of the present disclosure may insert an additional emission-off period OFP into the blank period BP for driving at a frame rate lower than the maximum frame rate set in the display device 1000 (see, e.g., FIG. 4, and FIG. 7 et. seq.). In terms of luminance, since the scan period SP has a luminance deteriorated characteristic substantially equivalent to that of the emission-off period OFP, the scan period SP may also be understood as substantially a kind of emission-off period OFP. Therefore, the numbers of emission-off periods OFP included in the same period for various frame rates (e.g., the sums of the number of scan periods SP and the number of emission-off periods OFP) may be similar to each other.

Figure 6:
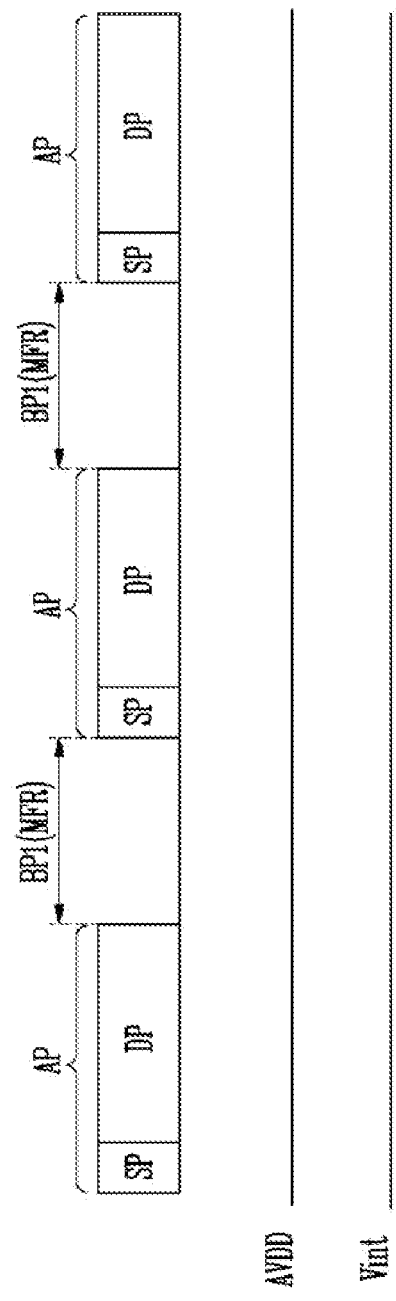
FIG. 6 is a signal timing diagram for an operation of the display device of FIG. 1 at a maximum frame rate.

FIG. 6 illustrates an example of an operation of the display device of FIG. 1 at a maximum frame rate. As shown in FIG. 6, each frame period may include an active period (AP) and a blank period (BP). Each active period may include a scan period (SP) and a display period (DP).

Referring to FIG. 1, FIG. 3, and FIG. 6, in a driving condition of a maximum frame rate MFR, a frame including an active period AP and a first blank period BP1 may be repeated. In an embodiment, FIG. 6 may be understood as schematically illustrating driving for one pixel or one pixel row, for example.

The first blank period BP1 may correspond to the maximum frame rate MFR set in the display device 1000. The maximum frame rate MFR may be determined by a protocol between the display device 1000 and an external graphics processor. For example, the maximum frame rate MFR may be set to 120 Hz.

In addition, the first blank period BP1 may correspond to the maximum frame rate MFR, and the blank period of the display device 1000 may not be shorter than the first blank period BP1.

An embodiment of the present disclosure provides a display device 1000 having a plurality of pixels PX, each connected to a power supply line VDD, VSS and/or Vint, a data line DL and a scan line SL1 and/or SL2; a controller 500 configured to divide each of a plurality of variable frequency frame periods into a respective active period AP and a respective blank period BP, determine a duration of at least one of the respective periods, and provide a scan control output SCS, a data control output DCS, and a power control output PCS based on the determined duration; a scan driver 200, or 220 and 240, connected to the scan control output and configured to supply a scan signal to the scan line SL1 and/or SL2; a data driver 300 connected to the data control output and configured to supply a data signal to the data line DL; and a power supply 400 configured to vary at least one variable supply voltage for at least one of the data driver 300 or the scan driver 200 based on the power control output. In an embodiment, the active period AP may include the scan period SP and the display period DP.

The controller 500 may count a duration of the first blank period BP1 to generate a count signal. The controller 500 may detect a duration of time of the first blank period BP1 by counting the number of clocks of the clock signal supplied during the blank period.

In an embodiment, when a count value included in the count signal reaches a reference value, the controller 500 may supply a start signal for outputting the first scan signal to the scan driver 200. Here, the reference value may be the duration of the first blank period BP1. Accordingly, when the display device 1000 is driven at the maximum frame rate MFR, and when the blank period (e.g., first blank period BP1) ends, the scan period SP may be executed. In the scan period SP, the same operation as that of the scan period SP described with reference to FIG. 3 and FIG. 4 may be performed.

The data signal DSj may be written to the pixel PXij by the operation of the scan period SP, and the light-emitting element LD may be momentarily turned off. At the maximum frame rate MFR, one frame may include one scan period SP.

When the display device 1000 is driven at the maximum frame rate MFR, the source driving voltage AVDD and the reference voltage Vint may each have a predetermined voltage level. For example, the source driving voltage AVDD may have a first level V1 shown in FIG. 7, and the reference voltage Vint may have a third level V3 shown in FIG. 7.

FIG. 7 illustrates an example of an operation of the display device of FIG. 1.

Referring to FIG. 1, FIG. 3, FIG. 6, and FIG. 7, the display device 1000 may display an image at a first frame rate FR1 that is slower than the maximum frame rate MFR.

FIG. 7 shows an example of signals supplied to one pixel (for example, the pixel PXij in FIG. 3). In FIG. 7 et. seq., signals supplied to one pixel (for example, the pixel PXij in FIG. 3, or the pixel in the first pixel row) may be mainly described. Driving such as the signal supply of FIG. 7 may be sequentially performed in a predetermined pixel row unit, or may be simultaneously performed in all pixel rows or some pixel rows.

In an embodiment, the controller 500 may detect the first frame rate FR1 by counting the time duration of the blank period BP. The slower the frame rate is, the longer the blank period BP may be. The blank period after the first blank period BP1 may be defined as a second blank period BP2.

In an embodiment, the first frame rate FR1 may correspond to half of the maximum frame rate MFR. Accordingly, the blank period BR is about twice the first blank period BP1, and the duration of the first blank period BP1 and the duration of the second blank period BP2 may be substantially the same. For example, the maximum frame rate MFR may be 120 Hz, and the first frame rate FR1 may be 60 Hz.

As described above, when the count value included in the count signal reaches the reference value within the blank period BP, the emission-off period OFP may be activated. That is, as shown in FIG. 7, the emission-off period OFP may be included in the second blank period BP2. For example, the count value may correspond to the duration of the first blank period BP1. Accordingly, the emission-off period OFP may be immediately activated after the first blank period BP1 ends.

In a first period P1 (e.g., the emission-off period OFP) included in the second blank period BP2, the same operation as in the emission-off period OFP described in FIG. 3 and FIG. 4 may be performed. The second blank period BP2 may include a second period P2 after the first period P1 and the emission-off period OFP are ended.

In the emission-off period OFP, the third transistor T3 is turned on, so that the reference voltage Vint is supplied to the second node, and the light-emitting element LD may be momentarily turned off. In the second period P2 after the first period P1, the light-emitting element LD may re-emit light based on the current generated in the emission-off period OFP.

Thereafter, in a third period P3 corresponding to the scan period SP of the active period AP, the second and third transistors T2 and T3 are turned on, so that the reference voltage Vint is supplied to the second node, and the light-emitting element LD may be momentarily turned off again. After the third period P3, the light-emitting element LD may emit light with luminance corresponding to the data signal supplied to the third period P3.

For example, according to the driving as shown in FIG. 7, the emission-off period OFP is additionally inserted in driving at 60 Hz of FIG. 5, so that the number of times the light-emitting element LD is turned off increases in real time, and average luminance in driving at 60 Hz may decrease. Accordingly, under the same grayscale value condition, average luminance of 120 Hz driving and average luminance of 60 Hz driving may be similar.

As such, the emission-off period OFP is additionally inserted in the blank period BP without frame delay according to the change of the frame rate lower than the maximum frame rate MFR, so that it is possible to control luminance fluctuation due to the variable driving frequency (frame rate).

The source driving voltage AVDD with the first level V1 may be supplied in the first blank period BP1 and the first period P1. The reference voltage Vint with the third level V3 may be supplied in the first blank period BP1 and the first period P1.

In an embodiment, when the supply of the first scan signal is terminated in the first period P1, the power supply 400 may transition (raise) the source driving voltage AVDD from the first level V1 to the second level V2. Thereafter, the power supply 400 may gradually decrease the source driving voltage AVDD from the second level V2 toward the first level V1 during the second period P2. However, the source driving voltage AVDD is not lower than the first level V1. For example, a voltage difference between the first level V1 and the second level V2 may be about 0.1 V.

In an embodiment, when the supply of the second scan signal is terminated in the first period P1, the power supply 400 may transition (e.g., lower) the reference voltage Vint from the third level V3 to the fourth level V4. Thereafter, the power supply 400 may gradually increase the reference voltage Vint from the fourth level V4 toward the third level V3 during the second period P2. However, the reference voltage Vint need not exceed the third level V3. For example, a voltage difference between the third level V3 and the fourth level V4 may be about 0.1 V.

The period in which the reference voltage Vint increases and the period in which the source driving voltage AVDD decreases may be terminated when the blank period BP ends. When the first frame rate FR1 is a divisor of the maximum frame rate MFR, the duration of the second blank period BP2 may be an integer multiple of the duration of the first blank period BP1. In an embodiment, when the duration of the second blank period BP2 is an integer multiple of the duration of the first blank period BP1, the source driving voltage AVDD supplied to the active period AP immediately after the second blank period BP2 may be the first level V1, and the reference voltage Vint may be the third level V3.

Accordingly, as shown in FIG. 7, when the duration of the second blank period BP2 is substantially the same as the duration of the first blank period BP1, the source driving voltage AVDD and the reference voltage Vint supplied from the third period P3 may be respectively the first level V1 and the third level V3. The corresponding voltage level may be maintained even in the first blank period BP1 restarted later.

Since both the first scan signal and the second scan signal are not supplied in the second period P2, both the second transistor T2 and the third transistor T3 may be turned off. Accordingly, changes in the reference voltage Vint and the source driving voltage AVDD do not affect the luminance of the pixel PXij in the blank period BP (particularly, the second period P2) and the blank period BP.

The reason for varying the reference voltage Vint and the source driving voltage AVDD and driving may be described in detail with reference to FIG. 8.

Figure 8:
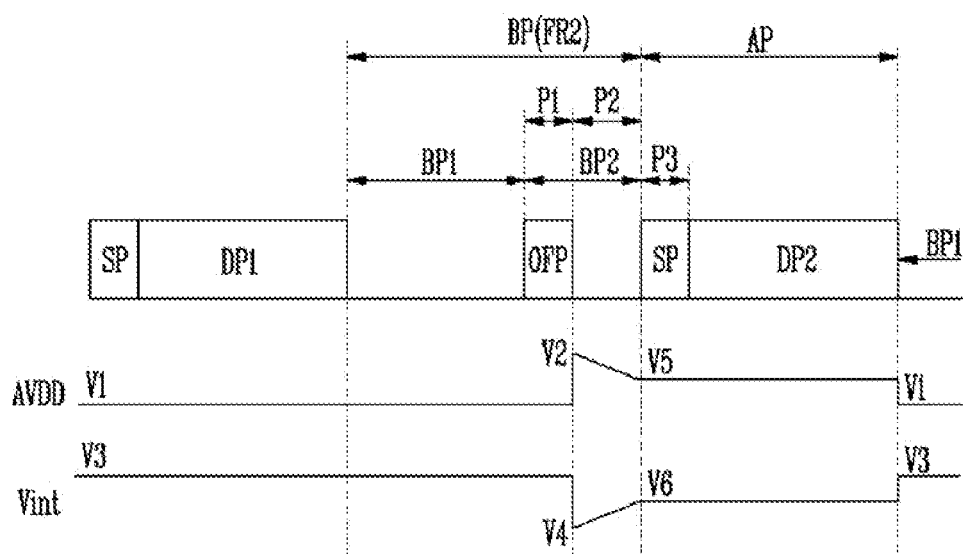
FIG. 8 is a signal timing diagram for an operation of the display device of FIG. 1.

FIG. 8 illustrates another example of an operation of the display device of FIG. 1.

Referring to FIG. 1, FIG. 3, FIG. 6, and FIG. 8, the display device 1000 may display an image at a second frame rate FR2 that is slower than the maximum frame rate MFR.

The controller 500 may detect the second frame rate FR2 by counting the time duration of the blank period BP. In an embodiment, the second frame rate FR2 may be a value between the maximum frame rate MFR and the first frame rate FR1. For example, the second frame rate FR2 may be 90 Hz.

As described above, the emission-off period OFP may be activated in the first period P1 immediately after the first blank period BP1 ends.

Meanwhile, since the second frame rate FR2 is faster than the first frame rate FR1, the duration of the second blank period BP2 may be reduced. Accordingly, an interval between the first period P1 that may be the emission-off period OFP, and the third period P3 that may be the scan period SP, may be narrowed. In other words, the emission-off interval of the light-emitting element LD may be reduced.

As described above, when an image is displayed at the second frame rate FR2, the interval P2 between the first period P1 and the third period P3 may be narrowed, and the average luminance may be lowered driving at the maximum frame rate MFR. In order to prevent such luminance deterioration, when the first period P1 ends, the source driving voltage AVDD may be increased to the second level V2, and the reference voltage Vint may be decreased to the fourth level V4. Here, a rate of change of the source driving voltage AVDD may be substantially the same as that of the source driving voltage AVDD described with reference to FIG. 7, and a rate of change of the reference voltage Vint may be substantially the same as that of the source driving voltage AVDD described with reference to FIG. 7.

During the second period P2, the source driving voltage AVDD may be changed at a predetermined ratio. During the second period P2, the reference voltage Vint may also be changed at a predetermined ratio. Voltage levels at a point in time when the second period P2 ends may be supplied to the active period AP, respectively.

For example, the source driving voltage AVDD supplied in the active period AP may be a fifth level V5, and the reference voltage Vint may be a sixth level V6. The fifth level V5 may be a voltage between the second level V2 and the first level V1, and the sixth level V6 may be a voltage between the third level V3 and the fourth level V4.

The source driving voltage AVDD is a voltage that may be used to generate gamma voltages of a data signal corresponding to a grayscale value. For example, a maximum gamma voltage, which is a largest voltage among the gamma voltages, may be determined by the source driving voltage AVDD. The gamma voltages may be determined by voltage values between the maximum gamma voltage and the minimum gamma voltage. For example, the gamma voltages may be determined based on a predetermined gamma curve (for example, a 2.2 gamma curve, or the like), and a shape of the gamma curve, which is a relationship between a grayscale value and a gamma voltage, may vary according to a magnitude of the source driving voltage AVDD.

Accordingly, as the source driving voltage AVDD increases, the data signal (e.g., gamma voltage) for the same grayscale value may increase. For example, a voltage level of a first grayscale value data signal generated by the source driving voltage AVDD of the fifth level V5 may be larger than that of a first grayscale value data signal generated by the source driving voltage AVDD of the first level V1.

The data signal may be supplied to the first node N1 (e.g., the gate electrode of the first transistor T1) of the pixel PXij by turning on of the second transistor T2.

The reference voltage Vint may be supplied to the second node (e.g., the source electrode of the first transistor T1) of the pixel PXij by turning on of the third transistor T3.

A difference between the data signal DSj and the reference voltage Vint supplied in the scan period SP may determine a gate-source voltage of the first transistor T1. However, under the same input grayscale value (e.g., input image data) condition, the gate-source voltage of the first transistor T1 that is determined based on the reference voltage Vint of the sixth level V6 and the source driving voltage AVDD of the fifth level V5 in driving at the second frame rate FR2 may be larger than the gate-source voltage of the first transistor T1 determined in driving at the first frame rate FR1 and the maximum frame rate MFR.

When the gate-source voltage of the first transistor T1 increases, the driving current may increase to increase the luminance of the light-emitting element LD. Accordingly, for the same grayscale value, the luminance of the light-emitting element LD in the second display period DP2 may be higher than that of the light-emitting element LD in the first display period DP1.

As described above, in order to compensate for luminance deteriorated due to a narrowing interval between the emission-off period OFP and the scan period SP, such as driving at the second frame rate FR2, a voltage difference between the source driving voltage AVDD and the reference voltage Vint may increase in the second display period DP2. Therefore, the gate-source voltage of the first transistor T1 in the second display period DP2 may be increased to increase the luminance of the light-emitting element LD, and the average luminance at the second frame rate FR2 may be similar to the average luminance at the maximum frame rate MFR. Therefore, luminance fluctuation (or flicker) according to a variable driving frequency (frame rate) may be further reduced.

Thereafter, when the active period AP ends, the source driving voltage AVDD and the reference voltage Vint may be supplied again at the first level V1 and the third level V3, respectively.

Meanwhile, the magnitudes of the source driving voltage AVDD and the reference voltage Vint supplied in the active period AP after the second blank period BP2 may be changed according to the duration of the second blank period BP2.

When the blank period BP ends and the active period AP starts, counting of the blank period BP is terminated by a signal indicating that the active period AP starts, and the scan period SP may proceed.

Figure 9:
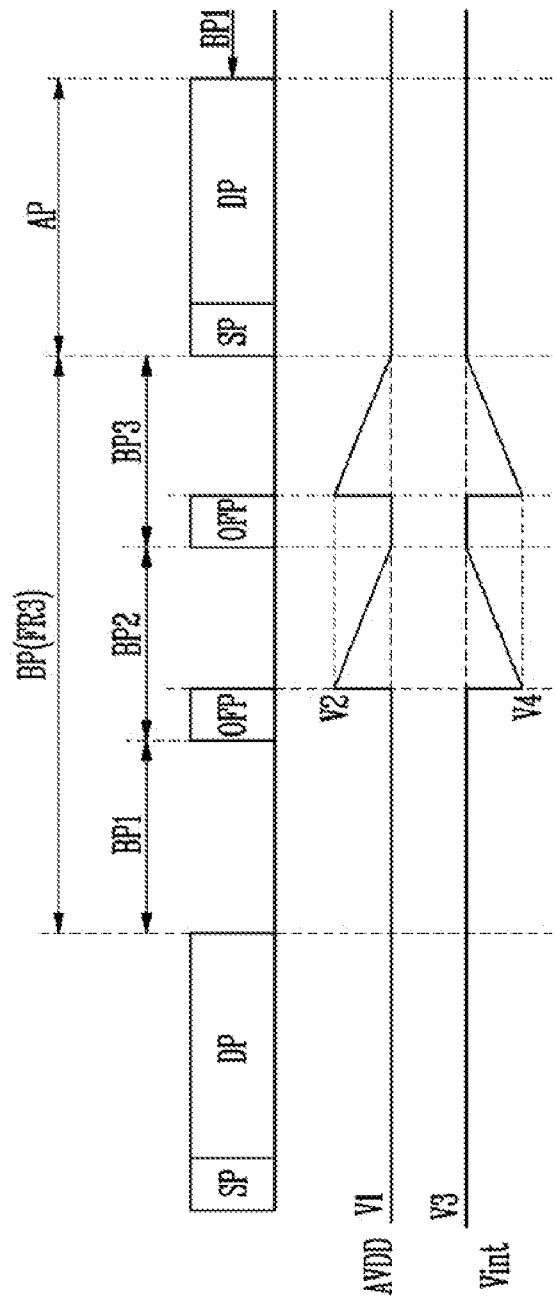
FIG. 9 is a signal timing diagram for an operation of the display device of FIG. 1.

FIG. 9 illustrates another example of an operation of the display device of FIG. 1.

Referring to FIG. 1, FIG. 3, FIG. 6, FIG. 7, and FIG. 9, the display device 1000 may display an image at a third frame rate FR3 that is slower than the maximum frame rate MFR.

The third frame rate FR3 is slower than the first frame rate FR1. For example, when the maximum frame rate MFR is 120 Hz, the third frame rate FR3 of FIG. 9 may be 40 Hz, which is ⅓ of the maximum frame rate MFR. Alternatively, the duration of the blank period BP may be three times the first blank period BP1.

In an embodiment, the emission-off period OFP may be activated whenever the value of the count signal reaches a reference value (e.g., the time duration of the first blank period BP1). In addition, in the blank period BP, whenever the emission-off period OFP ends, the source driving voltage AVDD and the reference voltage Vint may transition to the second level V2 and the fourth level V4, respectively.

Since the insertion of the emission-off period OFP (e.g., the output of the first scan signal), the change in the source driving voltage AVDD, and the change in the reference voltage Vint proceed in the form as shown in FIG. 9, the luminance control for a corresponding frame may be performed in real time even in a change in any frame rate of the maximum frame rate MFR or less. Therefore, luminance in variable frequency driving may be stably maintained, and image quality may be controlled.

Figure 10:
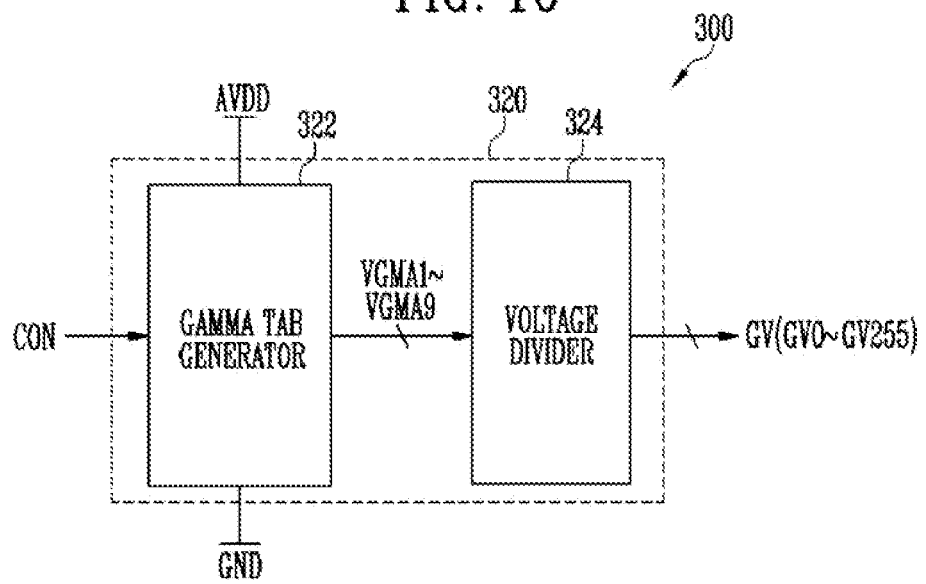
FIG. 10 is a block diagram of a portion of a data driver included in the display device of FIG. 1.

FIG. 10 illustrates a block diagram of an example of a portion of a data driver included in the display device of FIG. 1.

Referring to FIG. 1 and FIG. 10, the data driver 300 may include a gamma voltage generator 320.

The gamma voltage generator 320 may generate gamma voltages GV corresponding to grayscale values based on a gamma control signal CON supplied from the controller 500. In an embodiment, the gamma voltage generator 320 may include a gamma tap generator 322 and a voltage distributer 324. However, this is an example, and at least some of the constituent elements of the gamma voltage generator 320 may be configured as a separate circuit or IC outside the data driver 300.

The gamma tap generator 322 may determine magnitudes of first to ninth gamma tap voltages VGMA1 to VGMA9 based on the gamma control signal CON. For example, a first gamma tap voltage VGMA1 may be a gamma voltage (or voltage of the data signal) corresponding to a white grayscale value, and a ninth gamma tap voltage VGMA9 may be a gamma voltage (or voltage of the data signal) corresponding to a black grayscale value. However, this is an example, and the number of gamma tap voltages VGMA1 to VGMA9 is not limited thereto.

The voltage distributer 324 may generate the gamma voltages GV (e.g., voltages corresponding to the data signal) corresponding to all grayscale values of the display device 1000 based on the first to ninth gamma tap voltages VGMA1 to VGMA9. For example, the gamma voltages GV may include voltage values (for example, GV0 to GV255) corresponding to each of 256 grayscale values.

In an embodiment, the voltage distributer 324 may include a resistance string that divides the first to ninth gamma tap voltages VGMA1 to VGMA9. For example, the gamma voltages GV may be determined based on the first to ninth gamma tap voltages VGMA1 to VGMA9 and a predetermined gamma curve (for example, 2.2 gamma curve, or the like).

The first to ninth gamma tap voltages VGMA1 to VGMA9 may be selected from voltages between the source driving voltage AVDD and a ground voltage GND. Therefore, when the source driving voltage AVDD is changed, the first to ninth gamma tap voltages VGMA1 to VGMA9 and the gamma voltages GV may be adjusted. For example, when the source driving voltage AVDD increases, at least some of the gamma voltages GV may increase.

Accordingly, the gate-source voltage of the first transistor (e.g., driving transistor) of the pixel may be controlled by the adjustment of the source driving voltage AVDD.

In an embodiment, at least some of the constituent elements of the gamma voltage generator 320 may be included in the power supply 400. For example, the gamma tap generator 322 may be included in the power supply 400.

Figure 11:
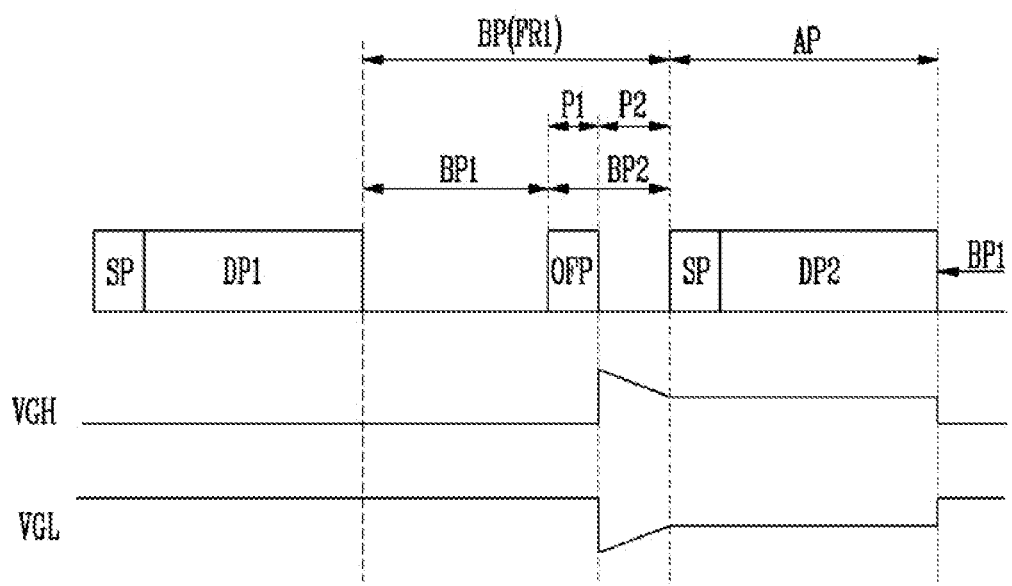
FIG. 11 is a signal timing diagram for an operation of the display device of FIG. 1.

FIG. 11 illustrates another example of an operation of the display device of FIG. 1.

In FIG. 11, the same reference numeral for the constituent elements described with reference to FIG. 8 is used, and redundant descriptions of these constituent elements may be omitted.

Referring to FIG. 1, FIG. 3, FIG. 4, and FIG. 11, the power supply 400 may adjust a gate level voltage for the scan driver such as a high voltage VGH and/or a low voltage VGL that determine a gate-on level and/or a gate-off level, respectively, of the first scan signal SL1 and the second scan signal SL2 based on the durations of the blank periods BP.

FIG. 11 illustrates that both the high voltage VGH and the low voltage VGL are controlled, but the present disclosure is not limited thereto, and only one of the high voltage VGH or the low voltage VGL might be controlled in alternate embodiments.

The high voltage VGH and low voltage VGL may affect the effective gate voltages of the second transistor T2 and the third transistor T3. Even if the second transistor T2 and the third transistor T3, which are switching transistors, are operated in saturation regions, the voltage levels of voltages supplied to the first node N1 and the second node N2 may be changed according to the voltage level of the gate voltage. For example, when the high voltage VGH of the second scan signal increases, the gate-source voltage of the second transistor increases, and the voltage supplied to the first node N1 may vary accordingly.

In an embodiment, the form of change of the high voltage VGH and the low voltage VGL may be similar to that of the source driving voltage AVDD and reference voltage Vint described with reference to FIG. 7 and FIG. 8, without limitation thereto. Accordingly, in response to the same grayscale value, the gate-source voltage of the first transistor T1 supplied to the scan periods SP is adjusted according to the duration of the blank period BP, and the luminance fluctuation according to the variable driving frequency or frame rate may be controlled. In alternate embodiments, it shall be understood that the time duration or duration may be of the blank period BP, or alternatively of the active period AP relative to the variable frame period.

Figure 12:
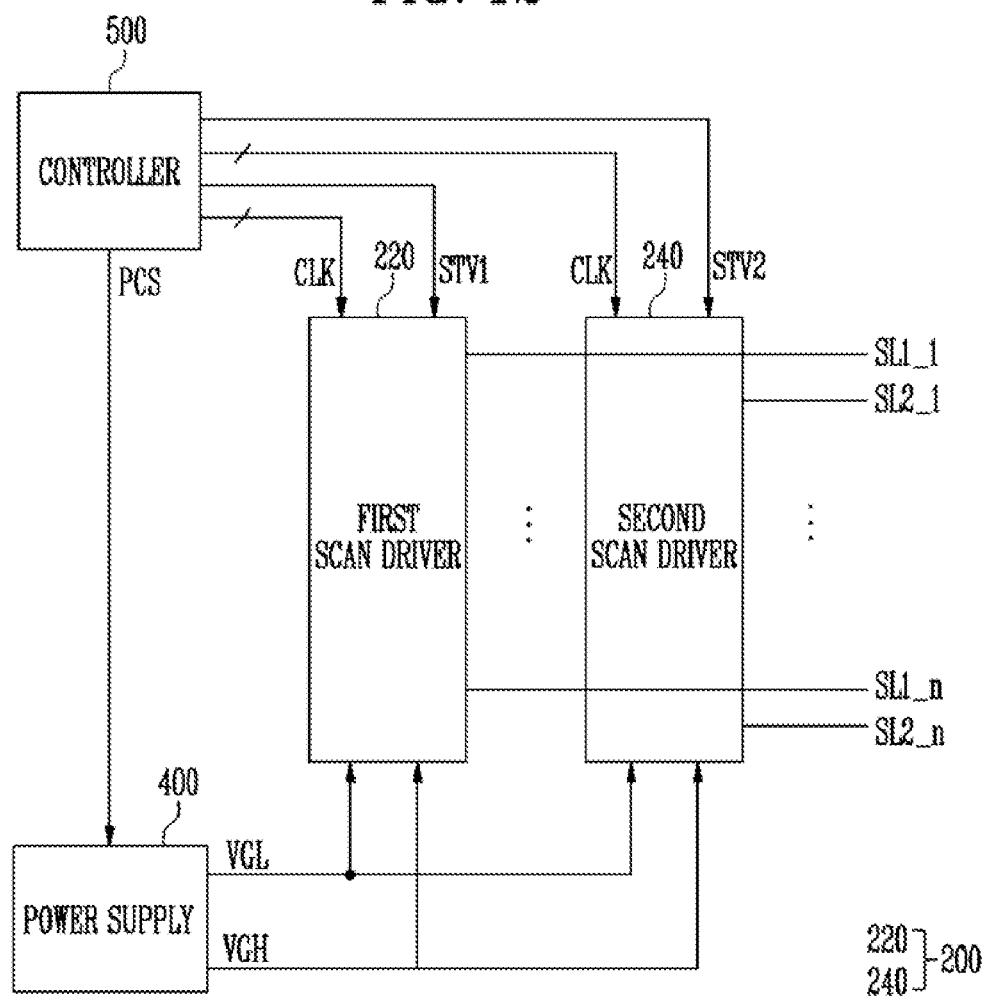
FIG. 12 is a block diagram of a portion of the display device of FIG. 1.

FIG. 12 illustrates a block diagram of an example of a portion of the display device of FIG. 1. In this embodiment, the power supply 400 includes two additional voltage outputs connected to a scan driver 200 of FIG. 1 that respectively supply the high voltage VGH and the low voltage VGL to the scan driver. Duplicate description may be omitted.

Referring to FIG. 1, FIG. 3, FIG. 4, and FIG. 12, the controller 500 may control the power supply 400 and the scan driver 200. The scan driver 200 may include a first scan driver 220 and a second scan driver 240.

The controller 500 may generate clock signals CLK and a first start signal STV1 and supply them to the first scan driver 220, and may generate the clock signals CLK and a second start signal STV2 and supply them to the second scan driver 240. The clock signals CLK, the first start signal STV1, and the second start signal STV2 may be included in the scan control signal SCS. The clock signals CLK supplied to the first scan driver 220 and the second scan driver 240 may be the same, or at least some thereof may be different.

The first scan driver 220 may sequentially supply a first scan signal in which the first start signal STV1 is shifted to first scan lines SL1_1 to SL1_n based on the clock signals CLK. A gate-on level and gate-off level of the first scan signal may be determined based on the high voltage VGH and the low voltage VGL, respectively supplied from the power supply 400 to the scan driver 200.

In an embodiment, the controller 500 may output the first start signal STV1 based on a count signal for counting the time of the blank period. Accordingly, the emission-off period OFP in which the first scan signal is supplied to the pixels PX during the blank period may be inserted.

The second scan driver 240 may sequentially supply a second scan signal in which the second start signal STV2 is shifted to second scan lines SL2_1 to SL2_n based on the clock signals CLK. A gate-on level and gate-off level of the second scan signal may be determined based on the high voltage VGH and the low voltage VGL supplied from the power supply 400, respectively.

The controller 500 may generate the power control signal PCS and supply it to the power supply 400.

The power supply 400 may generate the power control signal PCS based on the count signal for counting the time of the blank period.

In an embodiment, the power supply 400 may output the source driving voltage AVDD and/or the reference voltage Vint such as described with reference to FIG. 6 to FIG. 9 based on the power control signal PCS, without limitation thereto.

In another embodiment, the power supply 400 may generate the high voltage VGH and the low voltage VGL as described with reference to FIG. 11 based on the power control signal PCS, and supply them to the first and second scan drivers 220 and 240.

In an embodiment of the present disclosure, the variable supply voltage from the power supply 400 may include at least one variable gate level voltage VGH and/or VGL connected to the scan driver 200, 220 and 240, that controls at least one of a gate-on level or a gate-off level of the scan signal based on the determined duration of an active period AP and/or a blanking period BP, BP1 or BP2. The variable supply voltage may include at least one variable output connected to the scan driver that controls timing of the scan signal to the scan line SL1 and/or SL2 in the respective blank period based on the determined duration. The variable supply voltage may include at least one variable output connected to the scan driver that individually controls timing of first and second scan signals to first and second scan lines SL1 and SL2 of a same pixel PX in the respective blank period BP1 or BP2 based on the determined duration. The variable supply voltage may include at least one variable source driving voltage VDD, VSS and/or Vint connected to at least one of the data driver or the plurality of pixels that controls the data signal based on the determined duration. The variable supply voltage may include at least one variable reference voltage connected to the plurality of pixels and a source electrode of a pixel driving transistor T1 based on the determined duration.

Figure 13:
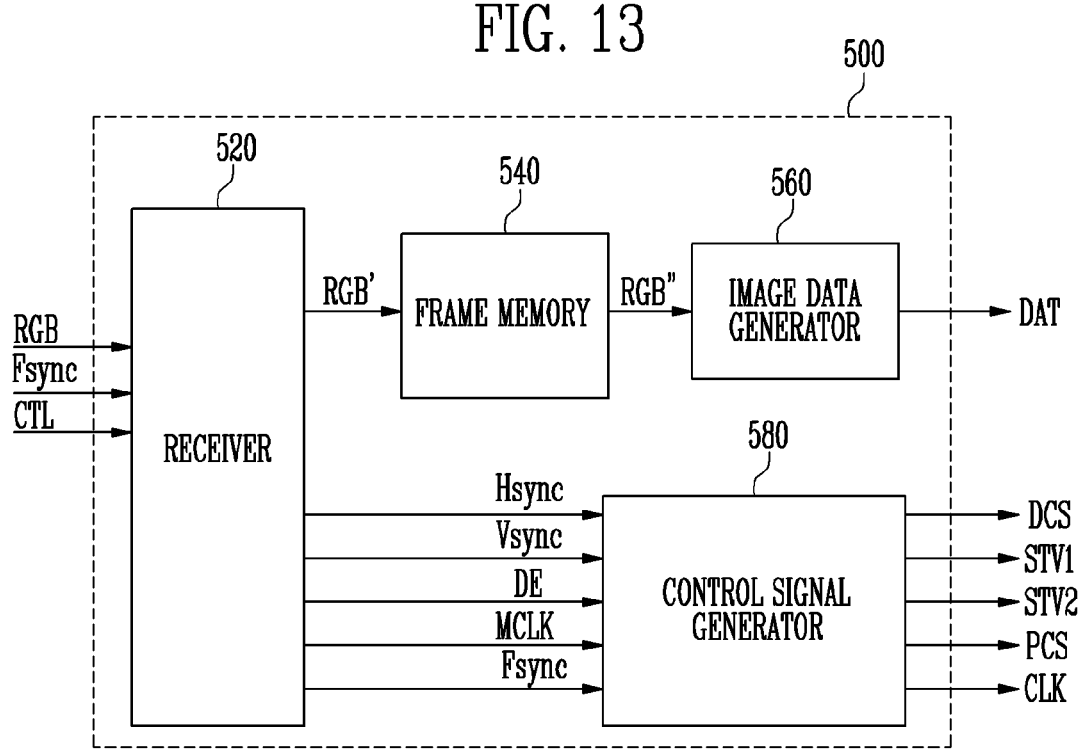
FIG. 13 is a block diagram of a controller of the display device of FIG. 1.

FIG. 13 illustrates a block diagram of an example of a controller of the display device of FIG. 1.

FIG. 13 illustrates only some constituent elements of the controller 500 related to the present disclosure.

Referring to FIG. 1, FIG. 2, and FIG. 13, the controller 500 may include a receiver 520, a frame memory 540, an image data generator 560, and a control signal generator 580.

The controller 500 may control, according to the duration of time of the blank period, the voltage levels of the source driving voltage AVDD and/or the reference voltage Vint output from the power supply 400, and the supply time point of the first start signal STV1 supplied to the first scan driver 220.

The receiver 520 may receive the image signal RGB, the control signal CTL, and a frame rate variable signal Fsync from the outside.

The frame rate variable signal Fsync is a signal indicating that the frame rate of the image signal RGB and the control signal CTL provided from an external graphics processor to the display device 1000 may be changed for each frame. The frame rate of the image signal RGB and the control signal CTL may vary depending on a rendering speed of the graphics processor.

The receiver 520 may restore the control signal CTL to the data enable signal DE. In addition, the receiver 520 may further restore a horizontal synchronization signal Hsync, a vertical synchronization signal Vsync, and a main clock signal MCLK based on the control signal CTL.

The frame memory 540 may delay an image signal RGB' output from the receiver 520 by one frame to output a delayed image signal RGB".

The image data generator 560 may convert the delayed image signal RGB" into image data DAT. The image data DAT may be provided to the data driver 300.

The control signal generator 580 may receive the horizontal synchronization signal Hsync, the vertical synchronization signal Vsync, the data enable signal DE, the main clock signal MCLK, and the frame rate signal Fsync, and may output the data control signal (DCS), the first start signal STV1, the second start signal STV2, the power control signal PCS, and the clock signals CLK to the scan drivers and/or power supply.

Figure 14:
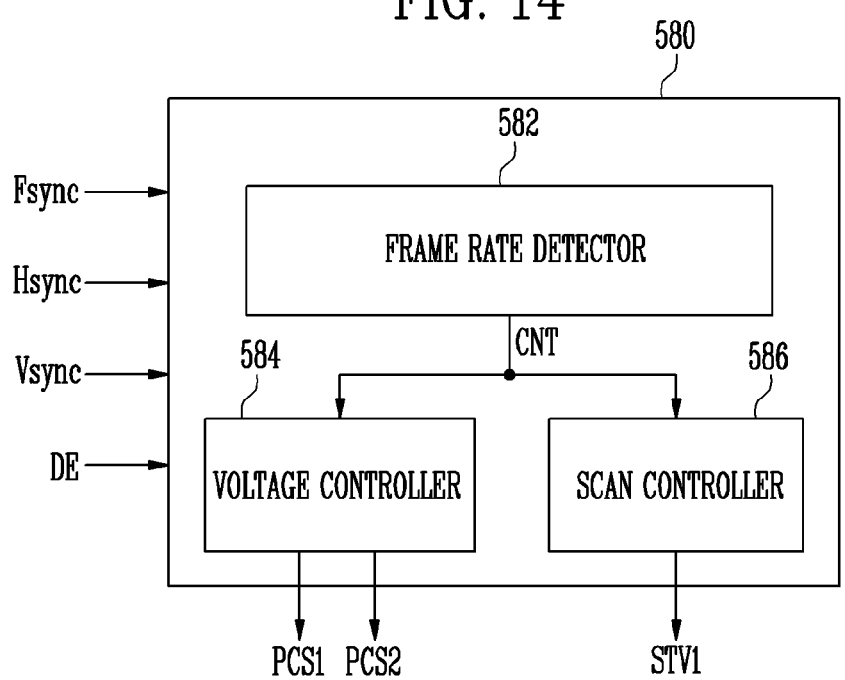
FIG. 14 is a block diagram of the controller of FIG. 13.

FIG. 14 illustrates a block diagram of an example of the controller of FIG. 13.

Referring to FIG. 1, FIG. 4, FIG. 6, FIG. 7, FIG. 8, FIG. 13, and FIG. 14, the control signal generator 580 may include a frame rate detector 582, a voltage controller 584, and a scan controller 586.

The frame rate detector 582 may detect a frame rate based on the variable frame frequency signal Fsync, and may generate the count signal CNT. In an embodiment, the frame rate detector 582 may distinguish the active period AP and the blank period BP of the data enable signal DE, and may count the time of the blank period BP, such as in increments of clock cycles MCLK or CLK.

For example, the frame rate detector 582 may generate the count signal CNT including information on the duration of the blank period BP by counting pulses of the main clock signal MCLK during the blank period BP. The count signal CNT may be provided to the voltage controller 584 and the scan controller 586.

In an embodiment, the control signal generator 580 may compare the count signal CNT with a reference value corresponding to the maximum frame rate. The reference value may correspond to the time duration of the first blank period BP1.

When the value of the count signal CNT reaches the reference value, the scan controller 586 may supply the first start signal STV1 for output of the first scan signal to the scan driver 200 (for example, first scan driver 220). Accordingly, the emission-off period OFP in which the first scan signal is supplied to the pixel PX may be inserted within the blank period BP of a frame rate of less than the maximum frame rate MFR.

In an embodiment, the reference value may be set for every integer multiple of the first blank period BP1. Accordingly, when the blank period BP is lengthened in duration, the emission-off period OFP may be inserted every integer multiple of the first blank period BP1.

In addition, when the blank period BP ends, the scan controller 586 may supply the first start signal STV1 to the scan driver.

The voltage controller 584 may control the source driving voltage AVDD and the reference voltage Vint in response to the count signal CNT. Furthermore, the voltage controller 584 may control the voltage levels of the high voltage VGH and/or the low voltage VGL in response to the count signal CNT.

A first power control signal PCS1 may be provided to the power supply 400 to control the source driving voltage AVDD. As shown in FIG. 8, the source driving voltage AVDD may have the first level V1 in the first blank period BP1 and the first period P1, and may be decreased from the second level V2 towards the fifth level V5 in the second period P2. The voltage level V5 of the source driving voltage AVDD at the ending time point of the second blank period BP2 may be maintained during the subsequent active period AP.

A second power control signal PCS2 may be provided to the power supply 400 to control the reference voltage Vint. As shown in FIG. 8, the reference voltage Vint may have the third level V3 in the first blank period BP1 and the first period P1, and may be increased from the fourth level V4 towards the sixth level V6 in the second period P2. The voltage level V6 of the reference voltage Vint at the ending time point of the second blank period BP2 may be maintained during the subsequent active period AP.

Figure 15A:
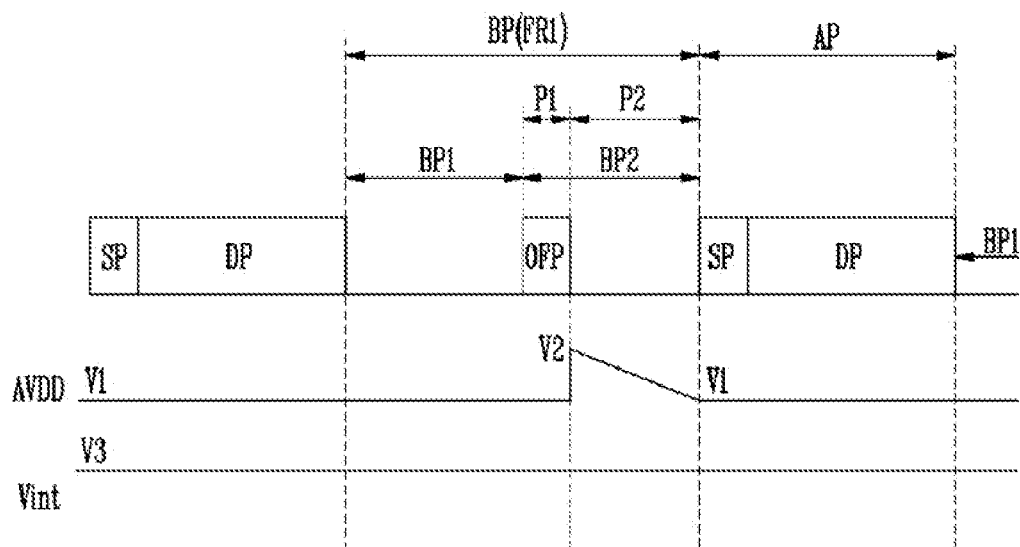
FIG. 15A is a signal timing diagram for an operation of the display device of FIG. 1.
Figure 15B:
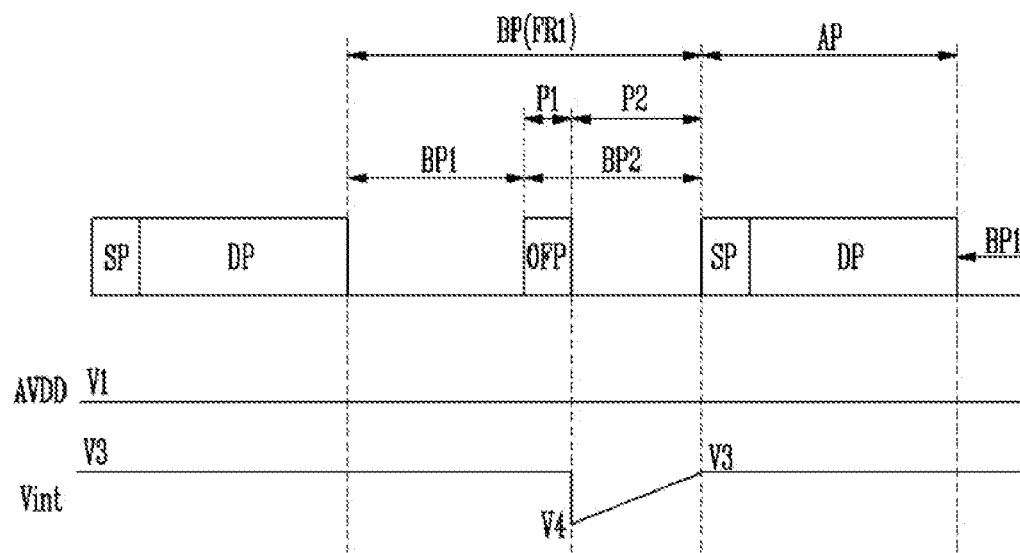
FIG. 15B is a signal timing diagram for an operation of the display device of FIG. 1.

FIG. 15A and FIG. 15B illustrate other examples of an operation of the display device of FIG. 1.

In FIG. 15A and FIG. 15B, the same reference numeral for the constituent elements described with reference to FIG. 7 are used, and redundant descriptions of these constituent elements may be omitted.

Referring to FIG. 15A and FIG. 15B, the display device 1000 may display an image at the first frame rate FR1 that is slower than the maximum frame rate MFR.

In an embodiment, as shown in FIG. 15A, the source driving voltage AVDD may be adjusted in the second period P2 of the second blank period BP2. The duration of the second period P2 may be inversely proportional to the frame rate.

The source driving voltage AVDD at the end of the second period P2 may be applied in a subsequent active period. Accordingly, the voltage level of the data signal may be changed, and the gate-source voltage of the first transistor (e.g., driving transistor) of the pixel may be controlled, through the adjustment of the source driving voltage AVDD.

In an embodiment, as shown in FIG. 15B, the reference voltage Vint may be adjusted in the second period P2 of the second blank period BP2. The reference voltage Vint at the end of the second period P2 may be applied in a subsequent active period. Accordingly, the gate-source voltage of the first transistor (e.g., driving transistor) of the pixel may be controlled through the adjustment of the reference voltage Vint.

Figure 16:
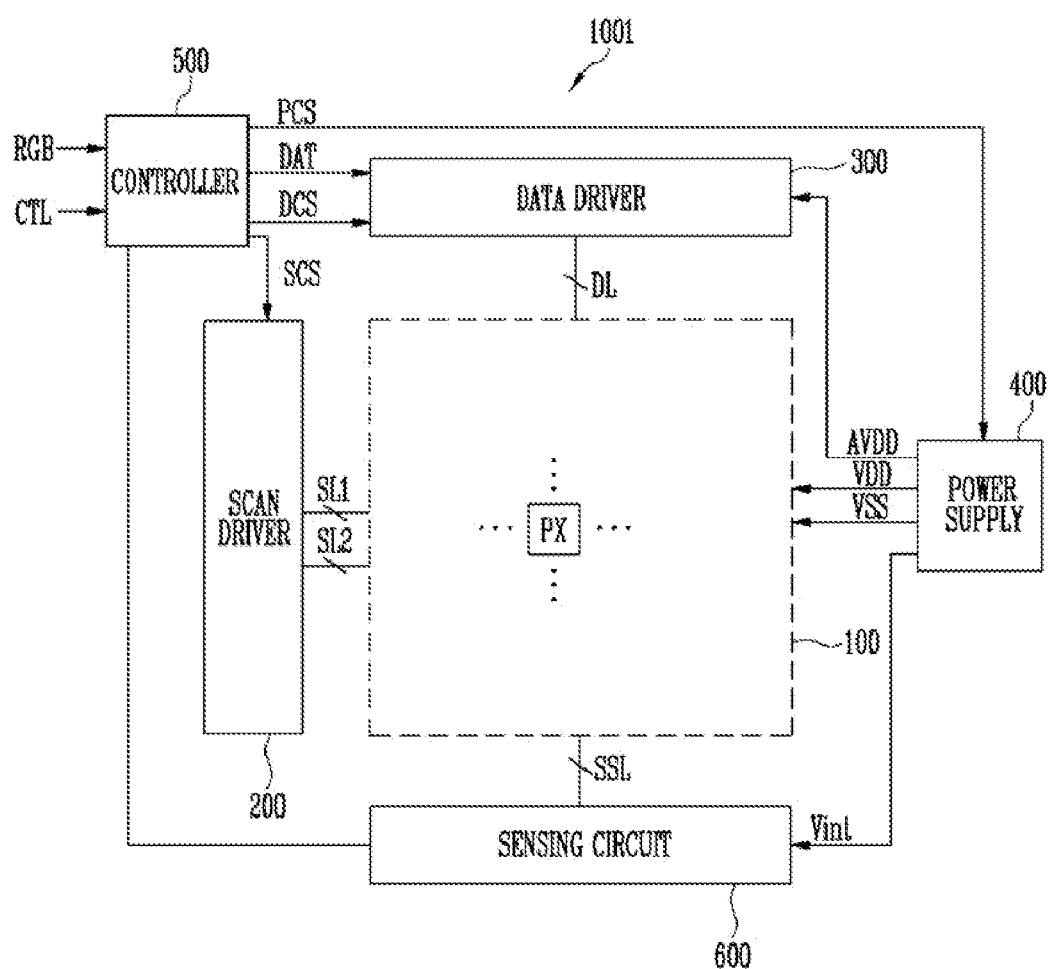
FIG. 16 is a block diagram of a display device according to an embodiment of the present disclosure.

FIG. 16 illustrates a block diagram of a display device according to an embodiment of the present disclosure.

In FIG. 16, the same reference numeral for the constituent elements described with reference to FIG. 1 is used, and redundant descriptions of these constituent elements may be omitted. In addition, a display device 1001 of FIG. 16 may have a configuration substantially same as or similar to the display device 1000 of FIG. 1, except for a sensing circuit 600 and a wire supplied with the reference voltage Vint.

Referring to FIG. 16, the display device 1001 may include the pixel unit 100, the scan driver 200, the data driver 300, the sensing circuit 600, the power supply 400, and the controller 500.

The controller 500 may further control an operation of the sensing circuit 600. For example, the controller 500 may control a timing for supplying the reference voltage Vint to the pixels PX through the sensing lines SSL and/or a timing for sensing a current generated in the pixel PX through sensing lines SSL.

The sensing circuit 600 may generate a compensation value for compensating characteristic values of the pixels PX based on sensing values (sensing currents) provided from the sensing lines SSL. For example, the sensing circuit 600 may detect and compensate for changes in a threshold voltage and mobility of a driving transistor, and a change in a characteristic of a light-emitting element, included in the pixel PX.

In an embodiment, the sensing circuit 600 may supply a predetermined reference voltage Vint to the pixel unit 100 through the sensing lines SSL during the emission-off period of the blank period and the scan period of the active period. In an embodiment, the reference voltage Vint may be provided from the power supply 400 to the sensing circuit 600.

Figure 17:
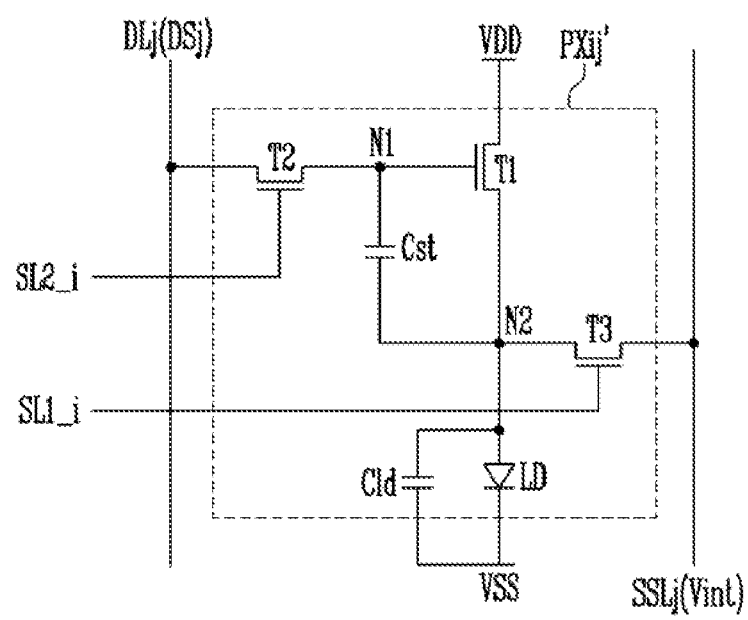
FIG. 17 is a circuit diagram of a pixel included in the display device of FIG. 16.

FIG. 17 illustrates a circuit diagram of an example of a pixel included in the display device of FIG. 16.

In FIG. 17, the same reference numerals for the constituent elements described with reference to FIG. 3 may be used, and redundant descriptions of these constituent elements may be omitted. In addition, a pixel PXij' of FIG. 17 may have a configuration substantially the same as or similar to the pixel PXij of FIG. 3, with the addition of a sensing line SSLj connected to the third transistor T3.

Referring to FIG. 17, the pixel PXij' may include the light-emitting element LD, the first transistor T1 (e.g., the driving transistor), the second transistor T2, the third transistor T3, and the storage capacitor Cst.

The third transistor T3 may be connected between the sensing line SSLj and the second electrode (e.g., second node N2) of the first transistor T1. The third transistor T3 may be turned on when the first scan signal is supplied to the first scan line SL1_i to electrically connect the sensing line SSLj and the second node N2 (e.g., the second electrode of the first transistor T1).

The reference voltage Vint may be supplied to the second node N2 through the sensing line SSLj, or a sensing value generated at the second node N2 may be supplied to the sensing circuit (e.g., 400 of FIG. 16).

However, this is exemplary, and the configuration of the pixel PXij' and the external compensation method may be variously changed.

As described above, in the display device according to this embodiment of the present disclosure, since the emission-off period is additionally inserted during the blank period without frame delay according to the change of the frame rate, it is possible to control luminance flickering due to varying of the driving frequency or frame rate.

In addition, in order to compensate for excessive luminance deteriorated due to an increase in the number of turn-offs of the light-emitting element due to the insertion of the emission-off period in the blank period, the voltage difference between the source driving voltage and the reference voltage may be controlled (for example, increased) according to the duration of the blank period.

Therefore, the gate-source voltage of the first transistor in the display period or active period is increased to increase the luminance of the light-emitting element, and the average luminance at an arbitrary frame rate may be similar to the average luminance level at the maximum frame rate.

Accordingly, since the luminance control for the frame is performed through the insertion of the emission-off period, the source driving voltage control, and/or the reference voltage control in real time such as based on the count of the blank periods even in the presence of any frame rate change, the average luminance in variable frequency driving may be stabilized, and the image quality may be maximized.

While this disclosure has been described in connection with what are presently considered to be practical embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:
   a pixel connected to each of a first scan line, a second scan line, and a data line;
   a scan driver to supply a first scan signal to the first scan line and a second scan signal to the second scan line;
   a data driver to supply a data signal to the data line; and
   a controller to receive image data, and to control the scan driver and the data driver to drive the pixel to display an image during a frame based on the image data, the frame being divided into an active period and a blank period,
   wherein the scan driver is configured to output the first scan signal in the blank period when the blank period is greater than a reference time duration,
   wherein the reference time duration is substantially the same as a first blank period corresponding to a maximum frame rate of the display device,
   wherein the pixel comprises a light-emitting element, a first transistor connected between a first driving power source and the light-emitting element and including a gate electrode connected to a first node, a third transistor to supply a reference voltage to a second node at which the first transistor and the light-emitting element are connected in response to the first scan signal supplied to a gate electrode thereof,
   wherein the blank period comprises the first blank period and a second blank period following the first blank period when the blank period is greater than the reference time duration,
   wherein the reference voltage gradually increases during the second blank period.

2. The display device of claim 1, wherein the controller is configured to generate a count signal indicative of a time duration of the blank period, and to control the scan driver to output the first scan signal in response to the count signal reaching a reference value corresponding to the reference time duration.

3. The display device of claim 2, wherein the controller is configured to supply a start signal to the scan driver to output the first scan signal.

4. The display device of claim 1, wherein the controller is configured to receive a control signal, and to detect a frame rate of the image data based on the control signal.

5. The display device of claim 1, wherein the pixel further comprises:
   a second transistor connected between the data line and the first node, and including a gate electrode connected to the second scan line; and
   a storage capacitor connected between the first node and the light-emitting element.

6. The display device of claim 5, wherein:
   the second blank period comprises a first period and a second period following the first period,
   the scan driver is configured to output the first scan signal in the first period; and
   the reference voltage is adjusted to have a third level in the first blank period and the first period, and to have a fourth level in the second period, the fourth level being less than the third level.

7. The display device of claim 6, wherein the reference voltage gradually increases from the fourth level during the second period.

8. The display device of claim 1,
   wherein the scan driver is configured to output the first scan signal in the second blank period.

9. The display device of claim 8,
   wherein the second blank period comprises a first period and a second period following the first period, and
   wherein the scan driver is configured to output the first scan signal in the first period.

10. The display device of claim 9, further comprising:
    a power supply to control a source driving voltage for the data driver based on control signals from the controller,
    wherein the power supply is configured to supply the source driving voltage of a first level in the first blank period and the first period, and to supply the source driving voltage of a second level in the second period, the second level being greater than the first level.

11. The display device of claim 10,
    wherein the source driving voltage gradually decreases from the second level during the second period.

12. A display device comprising:
    a pixel connected to each of a first scan line, a second scan line, and a data line;
    a scan driver to supply a first scan signal to the first scan line and a second scan signal to the second scan line;
    a data driver to supply a data signal to the data line; and
    a controller to receive image data, and to control the scan driver and the data driver to drive the pixel to display an image during a frame based on the image data, the frame being divided into an active period and a blank period,
    wherein the scan driver is configured to output the first scan signal in the blank period when the blank period is greater than a reference time duration, and
    wherein the reference time duration is substantially the same as a first blank period corresponding to a maximum frame rate of the display device,
    wherein the blank period comprises the first blank period and a second blank period following the first blank period when the blank period is greater than the reference time duration, and
    wherein the scan driver is configured to output the first scan signal in the second blank period.

13. The display device of claim 12, wherein the second blank period comprises a first period and a second period following the first period, and wherein the scan driver is configured to output the first scan signal in the first period.

14. The display device of claim 13, further comprising a power supply to control a source driving voltage for the data driver based on control signals from the controller,
wherein the power supply is configured to supply the source driving voltage of a first level in the first blank period and the first period, and to supply the source driving voltage of a second level in the second period, the second level being greater than the first level.

15. The display device of claim 14, wherein the source driving voltage gradually decreases from the second level during the second period.

16. The display device of claim 12,
wherein the controller is configured to generate a count signal indicative of a time duration of the blank period, and to control the scan driver to output the first scan signal in response to the count signal reaching a reference value corresponding to the reference time duration,
wherein the controller is configured to supply a start signal to the scan driver to output the first scan signal,
wherein the controller is configured to receive a control signal, and to detect a frame rate of the image data based on the control signal,
wherein the pixel comprises: a light-emitting element; a first transistor connected between a first driving power source and the light-emitting element, and including a gate electrode connected to a first node; a second transistor connected between the data line and the first node, and including a gate electrode connected to the second scan line; a third transistor to supply a reference voltage to a second node at which the first transistor and the light-emitting element are connected in response to the first scan signal supplied to a gate electrode thereof; and a storage capacitor connected between the first node and the light-emitting element.

17. A display device comprising:
a plurality of pixels, each connected to a power supply line, a data line, and a scan line;
a scan driver to supply a scan signal to the scan line;
a data driver to supply a data signal to the data line;
a power supply to generate at least one supply voltage for at least one of the data driver or the scan driver; and
a controller to receive image data, and to control the scan driver, the data driver, and the power supply to drive the plurality of pixels to display an image during a frame based on the image data, the frame being divided into an active period and a blank period,
wherein the at least one supply voltage comprises at least one of:
at least one source driving voltage connected to at least one of the data driver, the at least one source driving voltage being adjustable to control the data signal based on a time duration of the blank period, or
at least one reference voltage connected to a source electrode of a pixel driving transistor of at least one of the plurality of pixels through the power supply line, the at least one reference voltage being adjustable based on the time duration of the blank period.

18. The display device of claim 17, wherein the controller is configured to control the power supply to adjust the at least one source driving voltage and the at least one reference voltage when the time duration of the blank period is greater than a reference time duration.

19. The display device of claim 18, wherein the reference time duration is substantially the same as a first blank period corresponding to a maximum frame rate of the display device.

20. The display device of claim 19, wherein the controller is configured to generate a count signal indicative of the time duration of the blank period, and to control the power supply to adjust the at least one source driving voltage and the at least one reference voltage in response to the count signal reaching a reference value corresponding to the reference time duration.

* * * * *